(12) United States Patent
Maslen

(10) Patent No.: US 7,940,056 B2
(45) Date of Patent: May 10, 2011

(54) TIME-DOMAIN REFLECTOMETRY

(75) Inventor: Stephen Maslen, Somerset (GB)

(73) Assignee: Radiodetection Limited, Bristol (GB)

( * ) Notice: Subject to any disclaimer, the term of this patent is extended or adjusted under 35 U.S.C. 154(b) by 97 days.

(21) Appl. No.: 12/411,143

(22) Filed: Mar. 25, 2009

(65) Prior Publication Data

US 2010/0188095 A1  Jul. 29, 2010

(30) Foreign Application Priority Data

Mar. 25, 2008  (GB) .................................. 0805409.0

(51) Int. Cl.
 *G01R 31/11* (2006.01)
 *G01R 31/08* (2006.01)
(52) U.S. Cl. .......................... 324/533; 324/534; 324/535
(58) Field of Classification Search ........... 324/532–535
 See application file for complete search history.

(56) References Cited

U.S. PATENT DOCUMENTS

| | | | | |
|---|---|---|---|---|
| 5,481,195 A | * | 1/1996 | Meyer ............................ | 324/533 |
| 5,524,281 A | * | 6/1996 | Bradley et al. ................. | 324/601 |
| 7,245,129 B2 | * | 7/2007 | Wajcer et al. .................. | 324/533 |
| 7,429,866 B2 | * | 9/2008 | Beene ............................ | 324/601 |
| 2004/0015311 A1 | | 1/2004 | Furse et al. | |
| 2006/0181283 A1 | | 8/2006 | Wajcer et al. | |

* cited by examiner

*Primary Examiner* — Timothy J Dole
(74) *Attorney, Agent, or Firm* — Baker & Hostetler LLP

(57) ABSTRACT

The present invention provides a method of time domain reflectometry including transmitting a test signal along a cable under test from one end and sensing and recording a reflected signal from the cable at that end, using the recorded, reflected signal to estimate the distance, Ldist, from the one end to a discontinuity on the cable, separating a test signal component from the remainder, Vr, of the reflected signal; estimating the impedance, Zfault, of the discontinuity from known, predetermined values of the characteristic impedance, Zline, and of the characteristic gain, T, of a reference cable, and from the said separated test signal and reflected signal components, calculating the estimation error as a difference between the model reflection signal, Vrmod, expected of the cable under test based on the characteristic impedance and characteristic gain and the estimated impedance, Zfault and distance, Ldist, and the actual reflection signal Vr, choosing new estimated values of Ldist and Zfault in accordance with a predetermined algorithm such as to approach optimal values, repeating the aforesaid step of calculating the estimation error until a predetermined condition has been satisfied, and outputting the values of Ldist and Zfault that gave the least error.

19 Claims, 20 Drawing Sheets

TIME-DOMAIN REFLECTOMETRY

CROSS-REFERENCE TO RELATED APPLICATIONS

This application claims priority to GB 0805409.0, filed on Mar. 25, 2008 and entitled "Time-Domain Reflectometry," the disclosure of which is incorporated herein by reference in its entirety.

FIELD OF THE INVENTION

The invention relates to time domain reflectometry and a time domain reflectometer, and, in particular, to determining the location and characteristic of line discontinuities.

BACKGROUND OF THE INVENTION

Time domain reflectometers, TDR, provide a means to determine some characteristics of faulty and normal electrical transmission lines, by sending an excitation signal and receiving a reflected response with subsequent analysis.

FIG. 1 (Prior Art) shows, in general terms, the external appearance of a portable realisation of a TDR. Other realisations are possible, for instance a fixed installation wherein the TDR may be automatically controlled and would not require any user keypad or visual display.

FIG. 2 (Prior Art) shows the typical blocks that make up a TDR. These are:

Power Supply—which provides the necessary power to the various circuits

Processor/Memory—which as in many examples of modern instrumentation, provides overall operational control, processing of user actions, control of information provided to the user, management for the generation of test signals, management for the acquisition of measured signals, mathematical analysis of measurements and the application of signal processing algorithms. In this context, the term "user" might also mean a separate piece of linked system control equipment as well as a human operator.

User Interface(s)—in a portable TDR these would typically be a keypad for entering commands/data and a screen for the display of measured signals responses, derived measurements and system information. In fixed installation, the user interface might consist of serial communication port such as RS232 or USB.

Test Signal Generator—provides a test signal for application to the transmission line(cable) under test.

In practice it might be in the form of a voltage source or a current source. It might also be presented in either a single-ended (unbalanced) or a balanced form.

Traditional TDRs use a substantially rectangular pulse, or pulses that are smoother in nature such as a half-sine shape or a raised cosine shape. Other TDRs use a step waveform, which does not return to zero over the duration of the measurement. More complex waveforms may be used.

Line feed resistor(s)—these provide the correct matching impedance for the line being tested. When a signal travelling along a transmission line encounters a change in characteristic, a reflection occurs. This is also true for a reflected wave returning to the TDR instrument. The instrument should therefore present an impedance characteristic sensibly close to the impedance characteristic of the line under test, if it is to avoid causing further unwanted signal reflections.

The line feed resistor(s) are therefore provided to give the correct matching characteristic for the Line under test. Multiple selections may be provided to cater for various Line types.

In practical realisations, the Test Signal Generator might consist of a voltage generator which is then arranged in series with the Line Feed Resistor(s) or a current generator arranged in parallel with the Line Feed Resistor(s). These are equivalent as per the well-known Thevenin and Norton equivalent forms.

Also the signals might be provided (and responses measured) as either a single-ended or a balanced form which are well known in measurement systems. The later analysis is presented in the single-ended (unbalanced) form although this is easily extended to the balanced form, as is well known.

Additionally, some form of dc isolation might be provided between the TDR instrument circuitry and the connectors providing the access to the Line (cable) Under Test. Typically this is done by the use of capacitors whose value is chosen to have minimal effect on the signals generated to and received from the Line (cable) Under Test. If these capacitors do have a significant effect, it can be compensated for by use of traditional analogue or digital filter techniques.

Signal measurements—this block provides the ability to capture the electrical signals appearing on the TDR Line (cable) Under Test, access point. It can therefore acquire signals with or without the cable actually connected. Typically an input amplifier of suitable impedance when considered in conjunction with the Line Feed Resistor(s) will pass the signal to an Analogue to Digital Converter (ADC) which is used to capture signal values on a point by point basis in time, which are then passed via the processor to a memory store for later evaluation.

In a practical TDR, the effect on the measured signal due to any dc isolation may again be compensated for by use of traditional analogue or digital filter techniques. Also, the input amplifier/ADC circuit may be presented in either single-ended (unbalanced) or balanced configurations.

Access point—provides the terminal connections such that the cable under test can be connected to the instrument's test and measurement circuitry.

Whenever a signal travelling along a transmission line encounters some change (discontinuity) in the line characteristic, a portion of the signal is reflected back towards the sending end of the line. The nature of the reflection signal is determined by the discontinuity characteristic, which might be anywhere between a short circuit and an open circuit.

The primary objective for a TDR is usually to estimate the physical location of a line discontinuity such that it can be repaired or replaced if the unwanted effect is severe enough. A second objective is thus to determine the nature of the discontinuity and hence provide an estimate of the degree of severity for any unwanted effects that it may produce.

In broad terms, it is accepted that a reflection of the same polarity as the applied test signal denotes a fault impedance higher than the natural impedance of the transmission line. Conversely, a reflection of opposite polarity to the test signal indicates a fault impedance that is lower than the natural impedance of the transmission line.

The amplitude of the reflection provides an indication as to the severity of the impedance mismatch caused by the fault, with small mismatches producing small reflection amplitudes and large mismatches such as short or open circuit conditions producing larger reflections. Whilst the relative size of the reflection amplitude is dependant on the fault characteristic, the absolute value is also dependant on how far away the fault is and how much signal loss is introduced by the cable on the signal as it travels to and from the fault location.

Prior art techniques include the use of simple cable loss models together with measurements of test signal and reflection signal timings and amplitude measurements to provide estimates of the fault location and the fault characteristic. Such methods will always be limited in that they only provide a rough approximation to the actual physics of the signals in the transmission line.

The limitation of these simple techniques is due to the fact that they do not accurately take into account the detailed frequency-dependant transmission loss, transmission delay and cable impedance characteristic that exists in real cables.

FIG. 3 illustrates some simulated typical responses for a variety of fault conditions.

FIG. 3a shows the Line signal measured at the TDR, consisting of a test pulse and reflections for an open circuit at two different locations. As expected the high impedance fault produces a reflection signal of the same polarity as the test pulse. Also as expected, when the fault is further away, the reflection is smaller in amplitude due to additional loss due to the greater length of cable.

FIG. 3b shows the Line signal measured at the TDR, consisting of a test pulse and reflections for a short circuit at two different locations. As expected the low impedance fault produces a reflection signal of opposite polarity to the test pulse.

FIG. 3c shows the Line signal measured at the TDR, consisting of a test pulse and reflections for a 200 ohm fault at two different locations. Given that in this example the nominal cable impedance is 100 ohms, then again we see a reflection signal of the same polarity as the test pulse indicating a higher impedance fault.

FIG. 3d shows the Line signal measured at the TDR, consisting of a test pulse and reflections for 110 ohm fault at two different locations. Again, the nominal cable impedance is 100 ohms.

On this occasion, the simple rules for high and low impedance faults are no longer sufficient to evaluate the location and the nature of the fault.

In the first instance, the reflections are substantially opposite to the test pulse, indicating a low impedance fault. Secondly, the substantial portions of the reflections start significantly later in time than say the reflections for the 200 ohm faults seen in FIG. 3c, even though the faults occurs at the same two locations. In a practical situation where measurement noise could obscure the fine detail of the FIG. 3d traces, the fault would be falsely determined as a low impedance fault and at a positions later in time (further in distance) than are actually the case.

The failure to use an adequate description of the processes, can lead in this case to both the nature and position of the fault to be miscalculated.

More recently, frequency-domain analysis using FFTs has been applied to certain TDR measurements, to provide enhanced analysis.

SUMMARY OF THE INVENTION

Embodiments of the present invention advantageously provide a method of time domain reflectometry including transmitting a test signal along a cable under test from one end and sensing and recording a reflected signal from the cable at that end; using the recorded, reflected signal to estimate the distance, Ldist, from the one end to a discontinuity on the cable; separating a test signal component from the remainder, Vr, of the reflected signal; estimating the impedance, Zfault, of the discontinuity from known, predetermined values of the characteristic impedance, Zline, and of the characteristic gain, T, of a reference cable, and from the said separated test signal and reflected signal components; calculating the estimation error as a difference between the model reflection signal, Vrmod, expected of the cable under test based on the characteristic impedance and characteristic gain and the estimated impedance, Zfault and distance, Ldist, and the actual reflection signal Vr; choosing new estimated values of Ldist and Zfault in accordance with a predetermined algorithm such as to approach optimal values; repeating the aforesaid step of calculating the estimation error until a predetermined condition has been satisfied; and outputting the values of Ldist and Zfault that gave the least error.

Embodiments of the present invention also provide a time domain reflectometer for testing an electrical cable, including a test signal generator connected to a pair of terminals for connection to the ends of the electrical cable under test; and a signal processor connected to the terminals to receive a reflected signal from a test signal transmitted into the cable under test; the signal processor being programmed to sense and record a reflected signal from the cable; transmitting a test signal along a cable under test from one end and sensing and recording a reflected signal from the cable at that end; using the recorded, reflected signal to estimate the distance, Ldist, from the one end to a discontinuity on the cable; separating a test signal component from the remainder, Vr, of the reflected signal; estimating the impedance, Zfault, of the discontinuity from known, predetermined values of the characteristic impedance, Zline, and of the characteristic gain, T, of a reference cable, and from the said separated test signal and reflected signal components; calculating the estimation error as a difference between the model reflection signal, Vrmod, expected of the cable under test based on the characteristic impedance and characteristic gain and the estimated impedance, Zfault and distance, Ldist, and the actual reflection signal Vr; choosing new estimated values of Ldist and Zfault in accordance with a predetermined algorithm such as to approach optimal values; repeating the aforesaid step of calculating the estimation error until a predetermined condition has been satisfied; and outputting the values of Ldist and Zfault that gave the least error.

BRIEF DESCRIPTION OF THE DRAWINGS

In order that the invention may be better understood, a preferred embodiment will now be described, by way of example only, with reference to the accompanying drawings, in which:

FIG. 13b shows the error representing the difference between model and actual values in FIG. 13a;

FIG. 15b shows sample phase signals corresponding to FIG. 14a but after the values of Ldist and Zfault have been tuned, corresponding to FIG. 15a;

FIG. 16b shows an alternative example to that of FIG. 16a.

DETAILED DESCRIPTION

Glossary of Terms

Figure 1:
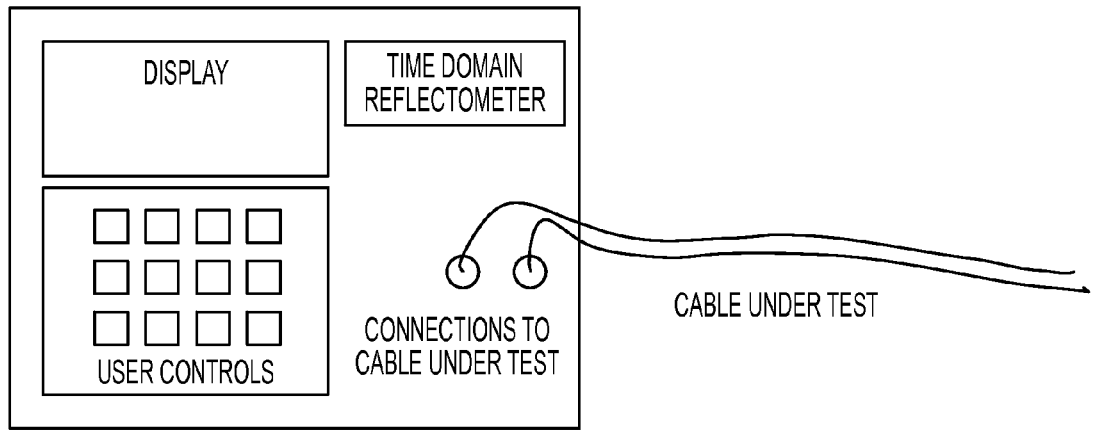
FIG. 1 shows diagrammatically a known time domain reflectometer.
Figure 2:
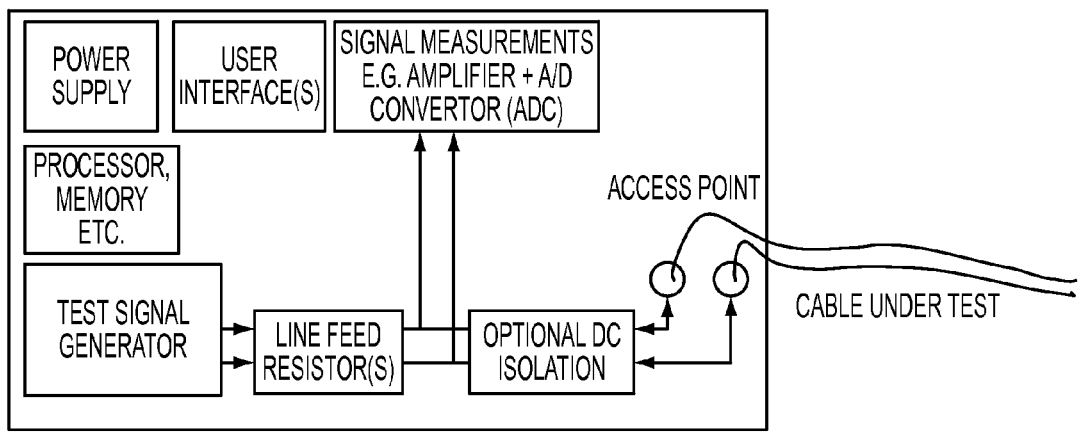
FIG. 2 shows typical components of the time domain reflectometer of FIG. 1.
Figure 3A:
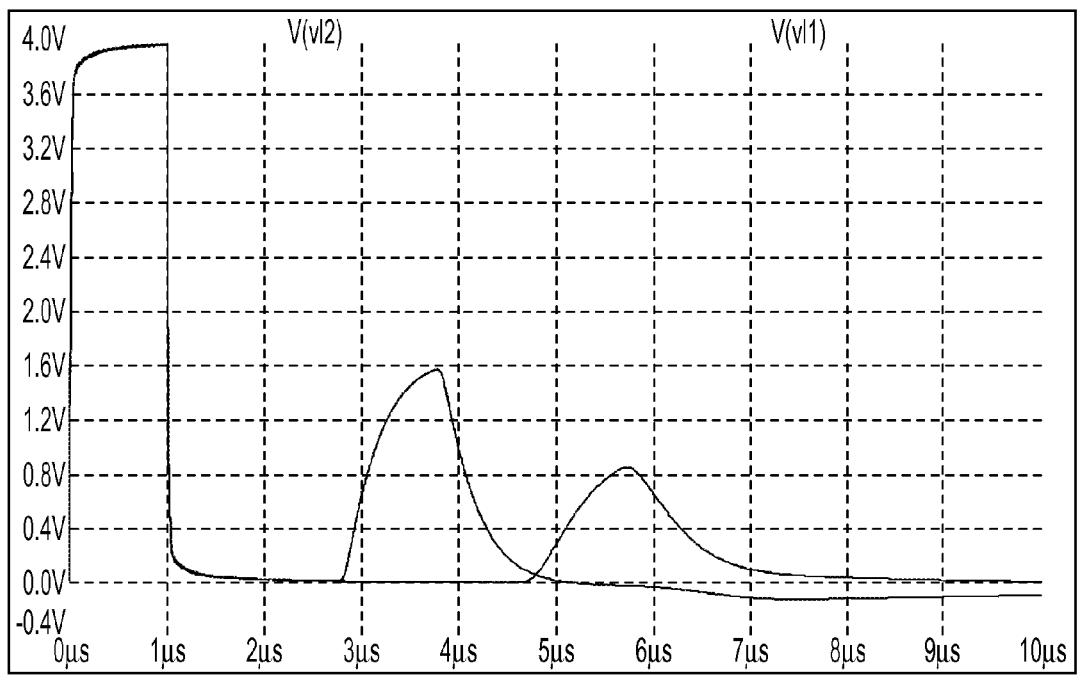
FIGS. 3a to 3d, referred to above, show typical signals measured from the cable attached to the TDR of FIGS. 1 and 2, for a variety of fault conditions.
Figure 3B:
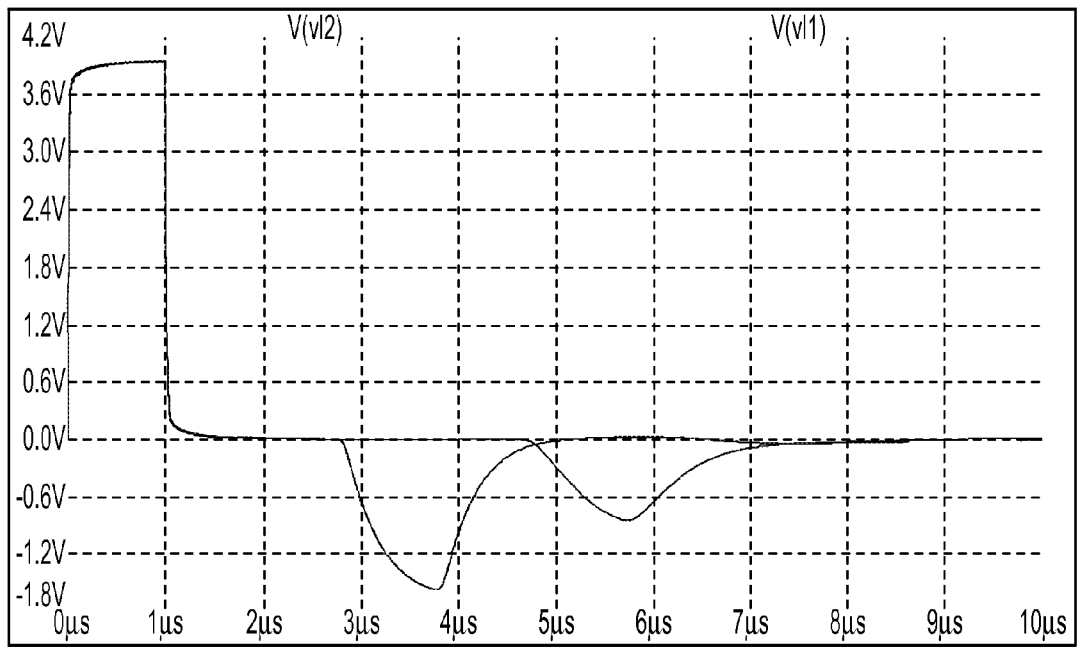
Figure 3C:
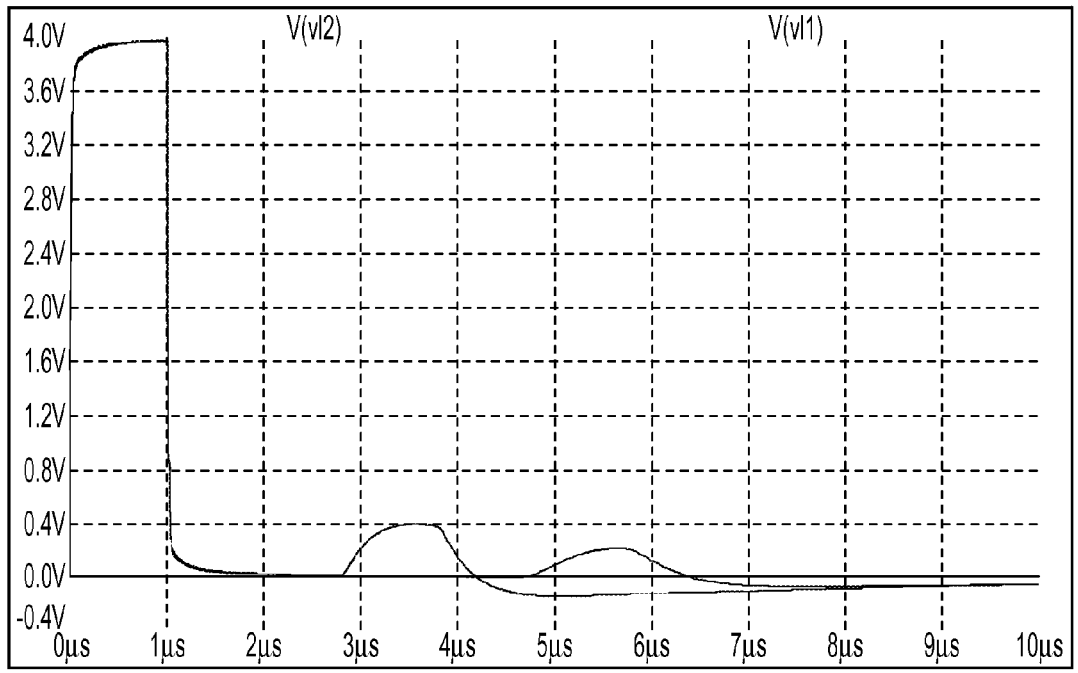
Figure 3D:
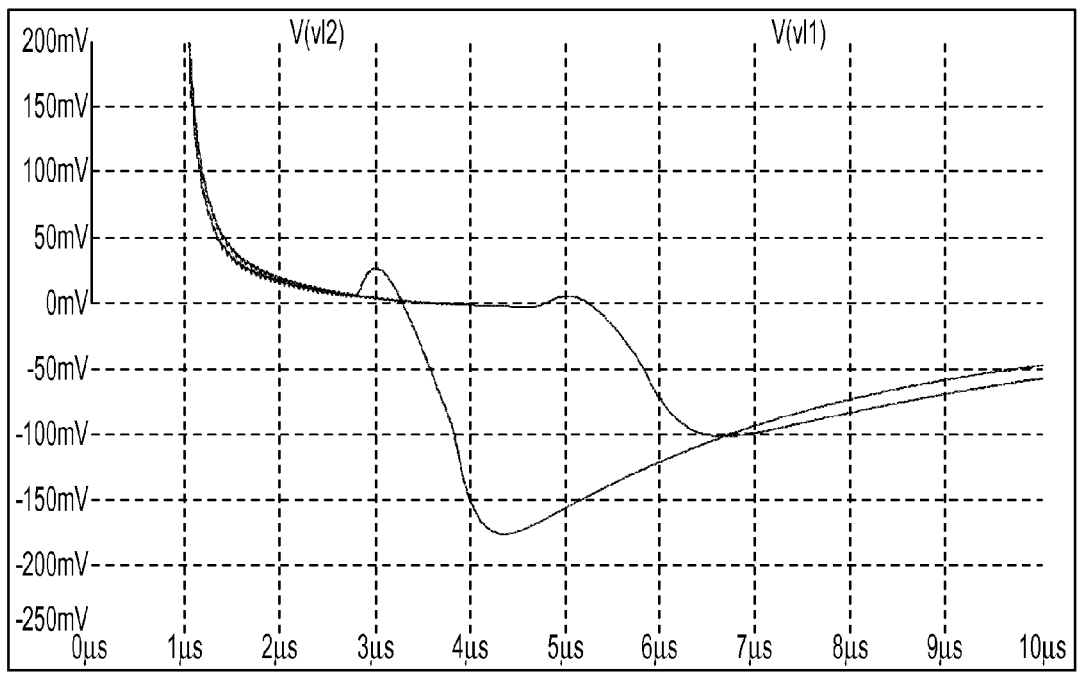

| Standard Engineering Terms | |
|---|---|
| TDK | Time Domain Reflectometer |
| RS232 | a serial data exchange arrangement |
| USB | Universal Serial Bus, a serial data exchange arrangement |
| ADC | Analogue to digital converter |
| FFT | Fast Fourier Transform |

| Standard Transmission Line Terms | |
|---|---|
| R | distributed line resistance per unit length |
| L | distributed line inductance per unit length |
| G | distributed line conductance per unit length |
| C | distributed line resistance per unit length |
| VOP | velocity of propagation |
| $\gamma(jw)$ | propagation characteristic = $\alpha(jw) + j\beta(jw)$ |
| $\alpha(jw)$ | magnitude of the transmission line loss at frequency w |
| $\beta(jw)$ | delay of the transmission line at frequency w |
| $\rho(jw)$ – ref. coeff. | $(Zfault(jw) - Zline(jw))/(Zfault(jw) + Zline(jw))$ |

| Special Terms | |
|---|---|
| Zline(jw) | complex, frequency dependant transmission line characteristic impedance |
| Zfault(jw) | complex, frequency dependant fault impedance terminating the transmission line |
| Rf | feeding resistance and its value |
| Rcal | value of a calibration resistor |
| T(jw) | complex, frequency dependant transmission line end to end characteristic gain |
| 1/T(jw) | complex, frequency dependant transmission line end to end characteristic loss |
| Lref | length of a reference piece of transmission line |
| $T_{Lref}(jw)$ | complex, frequency dependant transmission line gain characteristic for line length = Lref |
| $T_{2xLref}(jw)$ | complex, frequency dependant transmission line gain characteristic for line length = 2xLref |
| $T_{pu}(jw)$ | complex, frequency dependant transmission line gain characteristic for a line of unit length. |
| Ldist | length of a piece of transmission line |
| $T_{Ldist}(jw)$ | complex, frequency dependant transmission line gain characteristic for line of length Ldist |
| $T_{2xLdist}(jw)$ | complex, frequency dependant transmission line gain characteristic for line of length 2 xLdist |
| Vl(t) | the signal appearing on the line due to the test signal and any reflection |
| Vl(jw) | the frequency domain representation of Vl(t) |
| Vp(t) | a filtered version of Vl(t) ensuring that a period exists between the test signal component and the reflected signal component, whereby the signal effectively falls to zero. If this filtering is not necessary, then Vp(t) = Vl(t) |
| Vp(jw) | the frequency domain representation of Vp(t) |
| Vt(t) | that part of TDR line response appearing immediately after the application of the test signal and decaying to zero prior to any reflected signal. |
| Vt(jw) | the frequency domain representation of Vt(t) |
| Vr(t) | that part of TDR line response consisting only of the reflected signal. |
| Vr(jw) | the frequency domain representation of Vr(t) |
| Vt1(t) | that part of TDR line response appearing immediately after the application of the test signal and decaying to zero prior to any reflected signal on a piece of reference cable terminated in an open circuit. |
| Vt2(t) | that part of TDR line response appearing immediately after the application of the test signal and decaying to zero prior to any reflected signal on a piece of reference cable terminated in Rcal. |
| Vr1(t) | that part of TDR line response consisting only of the reflected signal on a piece of reference cable terminated in an open circuit. |
| Vr2(t) | that part of TDR line response consisting only of the reflected signal on a piece of reference cable terminated in Rcal. |
| Vt1(jw) | frequency domain equivalent of Vt1(t) |
| Vt2(jw) | frequency domain equivalent of Vt2(t) |
| Vr1(jw) | frequency domain equivalent of Vr1(t) |
| Vr2(jw) | frequency domain equivalent of Vr2(t) |
| Vrmod(t) | reflection signal produced by the transmission line + fault model. |
| Vrmod(jw) | frequency domain equivalent of Vrmod(t) |

The preferred embodiment will now be described.

A first step is to create a detailed physics reference model of the transmission line (cable) under test in respect of its effect on a signal applied at one end as it moves along the length of the cable a specified distance. This requires knowledge of the cable loss characteristic.

A second step is to create a detailed physics reference model of the effect of a general fault condition, which produces a reflection, when a signal is applied to it. This requires knowledge of the cable impedance characteristic, Zline.

The loss characteristic for a transmission line can be represented in a number of different ways. If T(jw) is the traditional frequency gain response then the transmission line loss characteristic is:

$$1/T(jw) = \text{transmission line input}(jw)/\text{transmission line output}(jw)$$

where $j=\sqrt{-1}$ and w=frequency in Rads/second, and

T(jw) can be expressed in the usual polar form as:

|T(jw)|=the magnitude of T(jw) and

∠T(jw)=the phase(delay) in Rads of T(jw) or in the alternative rectangular form: Re T(jw) and Im T(jw).

The rectangular form is particularly useful in that the Real and Imaginary description of the Transmission Line Loss characteristic can be multiplied by the FFT of a desired input signal to produce the resultant transmission line output signal by means of the well-known frequency domain convolution. This output signal may then be converted to a time domain signal by means of the inverse FFT, if desired.

A further traditional representation of the transmission line loss characteristic from the fundamental theory of transmission lines is:

propagation characteristic $\gamma=\alpha+j\beta=\sqrt{((R+Ls)(G+Cs))}$   (1)

where $\alpha$ is the loss per unit length in Nepers/Unit Length, $\beta$ is the delay per unit length in Rads/Unit length, and in general, $\gamma$ is complex and R,L,G & C are frequency dependent.

It is noted that the loss $\alpha$ and the delay $\beta$ are for a unit length of line and that the loss and delay for any length Ldist is thus $\alpha$(Ldist)=$\alpha$Ldist and $\beta$(Ldist)=$\beta$Ldist.

It is also noted that the Neper is a logarithmic measure: 1 Neper=8.686 dB.

Although not essential, it is highly desirable that the TDR can itself gather the reference data for T(jw) and later for Zline(jw), using its normal test signals, normal measurement capabilities and suitable signal analysis.

A user can thus gather the required reference data on a reference sample of cable and then make subsequent measurements on potentially faulty cables, all with the same instrument.

One reference, i.e., Application note AN-4, May 1989 from www.picosecond.com, Picosecond Pulse Labs, "TDR, Step Response and "S" Parameter Measurements in the Time Domain", James R. Andrews, describes suitable methods derived from academic papers presented in the mid 1970s for the measurement of the loss data using pulse signals and FFT analysis.

Another reference, i.e., 1969 IEEE International Solid-State Circuits Conference, "Wide Band Impedance Measurement by Fourier Transformation of Network Pulse Response" by A. S. Farber and C. W. Ho, pages 170, 171 and 185, describes suitable methods for the measurement of impedance data using pulse signals and FFT analysis.

Obtaining the Reference Data by TDR Measurement and Calculations

When a reflection signal is used to measure cable loss for a cable of length Ldist terminated in an open circuit, then that signal has in fact travelled a distance of 2×Ldist from its point of origin.

The complex reference data for the loss in a cable of length Lref, $1/T_{2\times Lref}$(jw) is obtained by:

Selecting a piece of reference cable with its far end in an open circuit condition.

The reference cable should be of sufficient length=Lref that a reflected signal can be seen in isolation from the applied test signal i.e. any effects at the input end should sensibly have reduced to zero (or can be made so by suitable filtering) prior to the reflection signal appearing.

Using the TDR to apply a test signal to a reference length of cable.

Using the TDR to measure the resultant signal Vp(t), which may have needed some transient filtering to ensure that Vt(t) and Vr(t) are separated by a period of zero signal.

Separating the test signal response Vt(t) from the Vr(t) reflection response.

Performing an FFT operation on the test signal response and the reflection response.

Taking the FFT(Vr(t))=Vr(jw).

Taking the FFT(Vt(t))=Vt(jw).

Dividing Vr(jw) by Vt(jw) to get the transmission gain characteristic $T_{2\times Lref}$(jw) for 2×Lref (signal travels the length of Lref and back again.) for the reference length Lref.

Cable loss for 2×Lref=$1/T_{2\times Lref}$(jw).

A nominal value for the velocity of propagation (VOP) of the reference cable may now be obtained by calculating 2*Lref/(time of first discernible response of Vr(t)–time of first discernible response of Vt(t)).

A "region of validity" should be determined for the use of $T_{2\times Lref}$(jw). This may be determined by looking at the values for Vr(jw). The reflection response is typically stronger at lower frequencies and diminishes to a negligible level as the frequency increases. If the TDR circuitry includes dc isolation, then very low frequency amplitudes will also diminish to negligible levels.

The information in $T_{2\times Lref}$(jw) should only be used for frequencies where |Vr(jw)| is significant and well-behaved i.e. free from sharp variations. An example of a suitable region of validity might be—From an initial frequency point whereby for increasing frequency, |Vr(jw)| rises to 75% of its maximum value for the last time up to a final frequency point whereby, |Vr(jw)| first falls to 10% of its maximum value.

Figure 5:
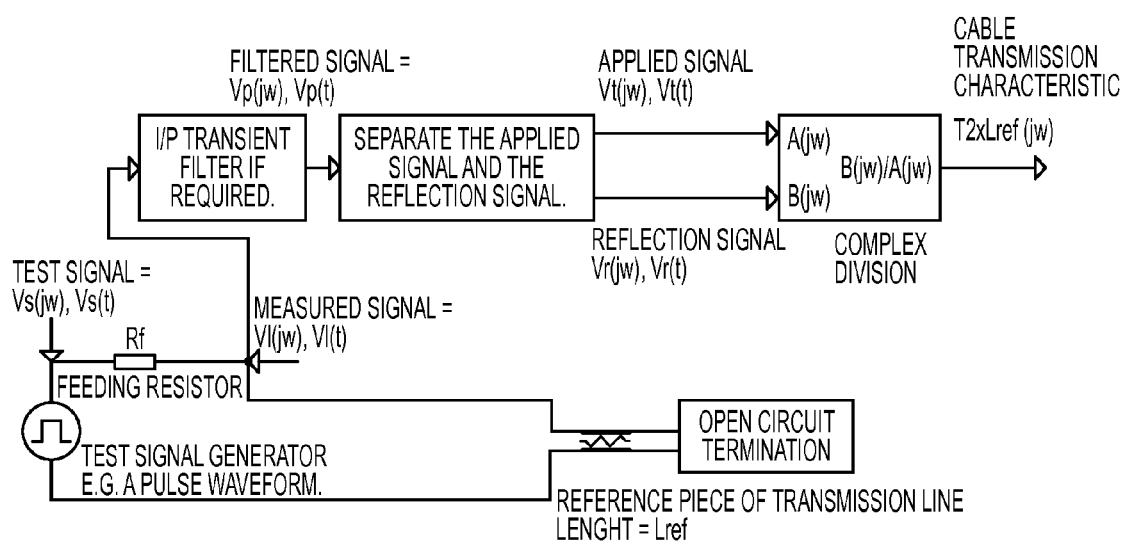
FIG. 5 represents diagrammatically the use of the TDR process to determine a model cable transmission characteristic.

The arrangement for this is shown in FIG. 5.

Figure 6A:
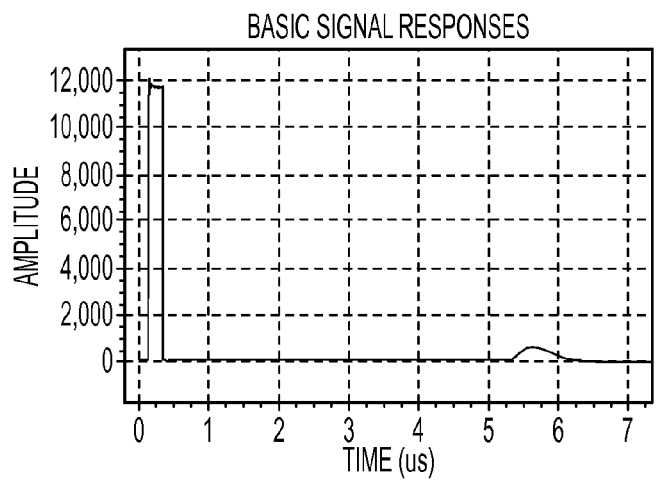
FIGS. 6a, 6b and 6c represent sample signals obtained using the process of FIG. 5.
Figure 6B:
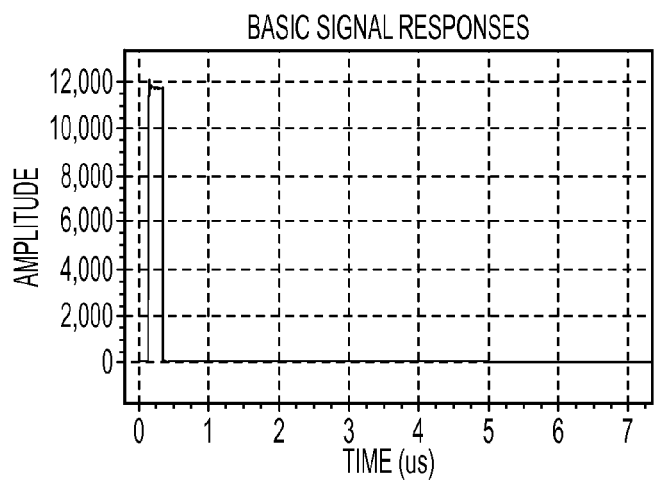
Figure 6C:
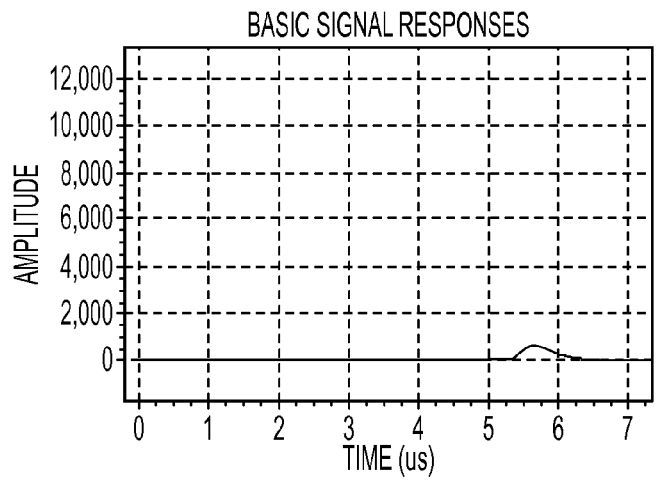

Sample signals for Vp(t), Vt(t) & Vr(t) are shown in FIGS. 6a, 6b & 6c.

In this example for an Lref of 551 m, the nominal value of VOP may be calculated from FIG. 6a as:

VOP=2×551/(5.3 us–0.15 us)=213.98×10^6 m/second or 71.38% of the speed of light.

Figure 7A:
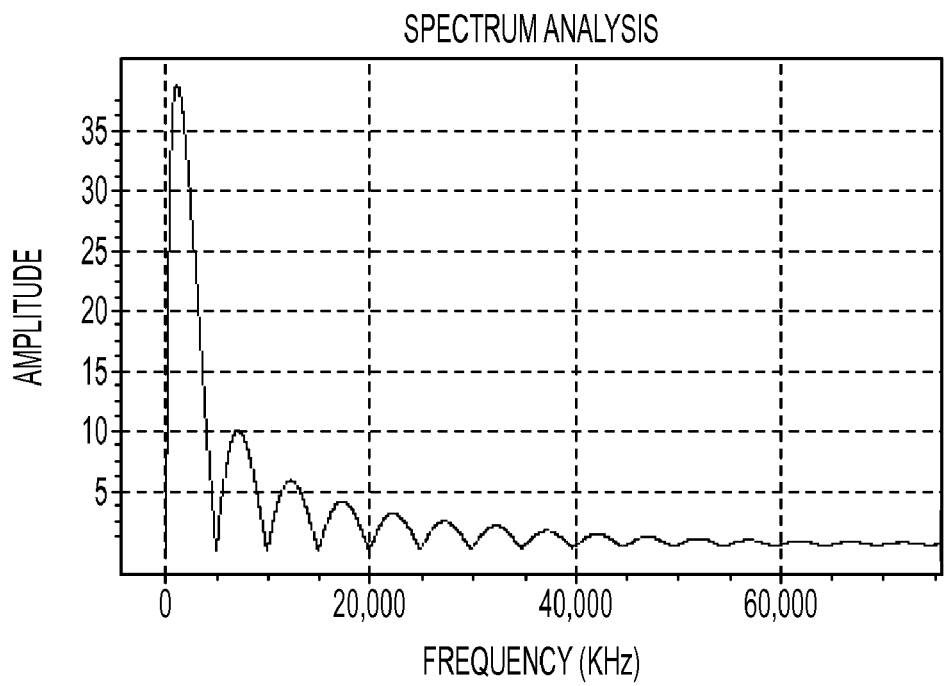
FIGS. 7a, 7b, 7c and 7d show further signals obtained using the process of FIG. 5.
Figure 7B:
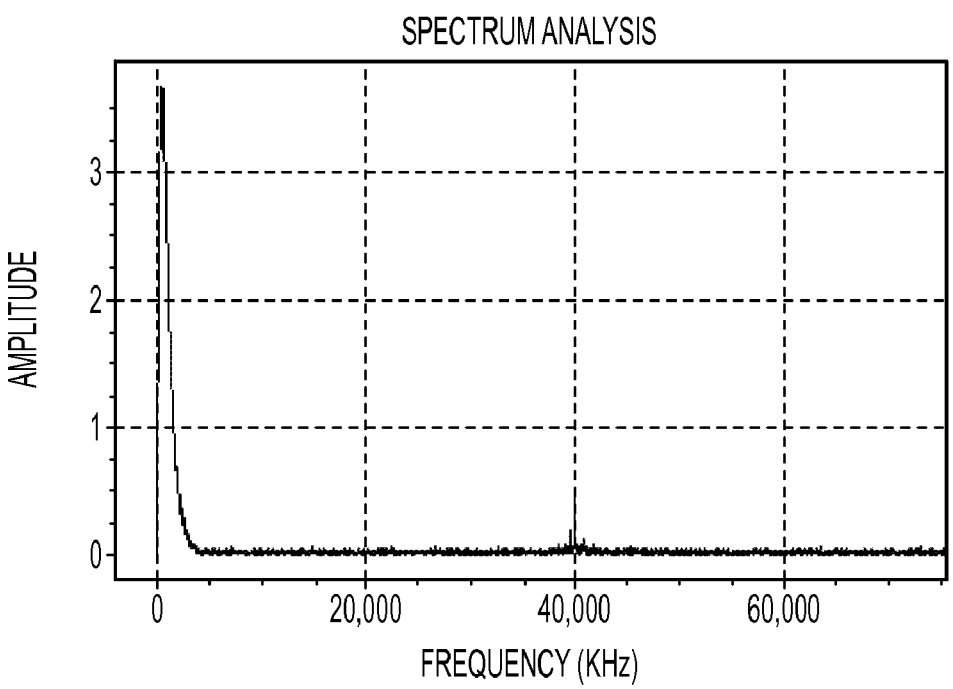
Figure 7C:
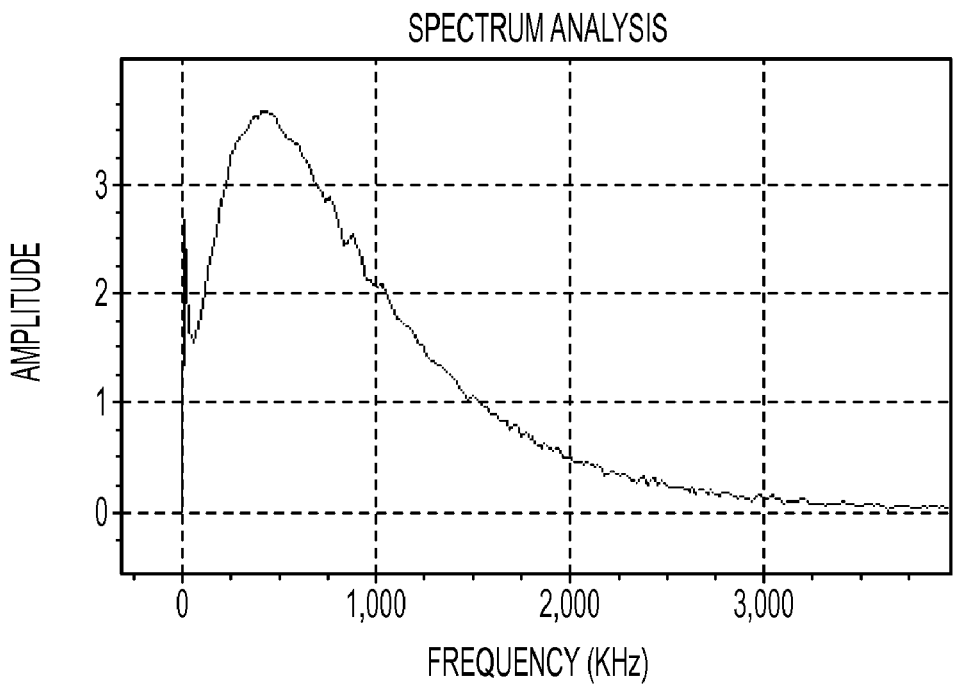

Sample signals for |Vt(jw)|, |Vr(jw)| and the detail of |Vr(jw)| are shown in FIGS. 7a, 7b and 7c. In this case the valid frequency range is determined as above from the trace in FIG. 7c, to be 194 kHz to 2.2 MHz.

Figure 7D:
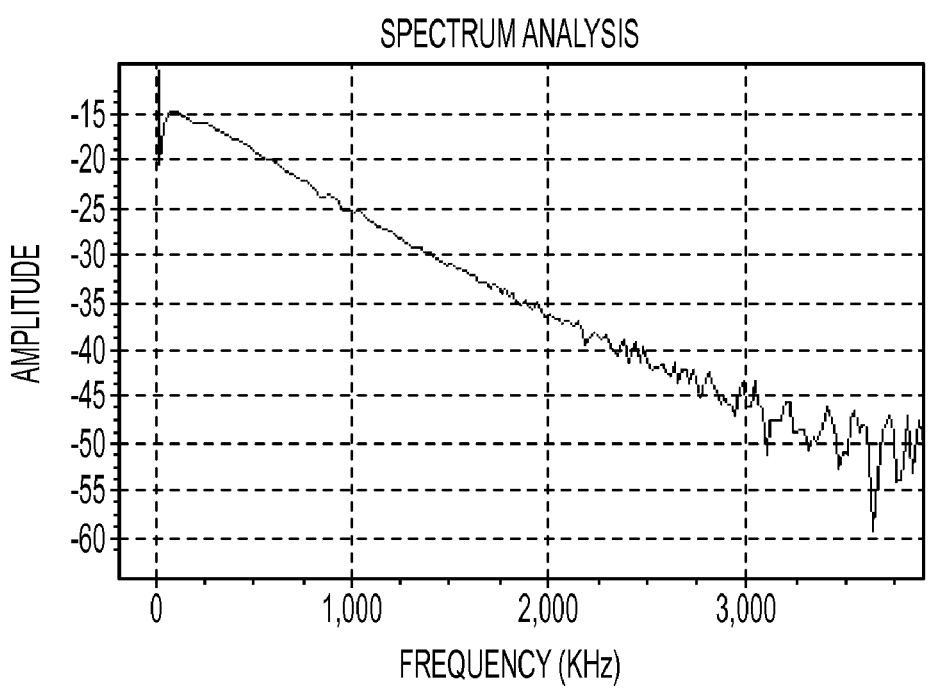

FIG. 7d shows the calculated transmission gain in logarithmic form, i.e. 20 $\log_{10}$(|$T_{2\times Lref}$(jw)|).

Figure 8:
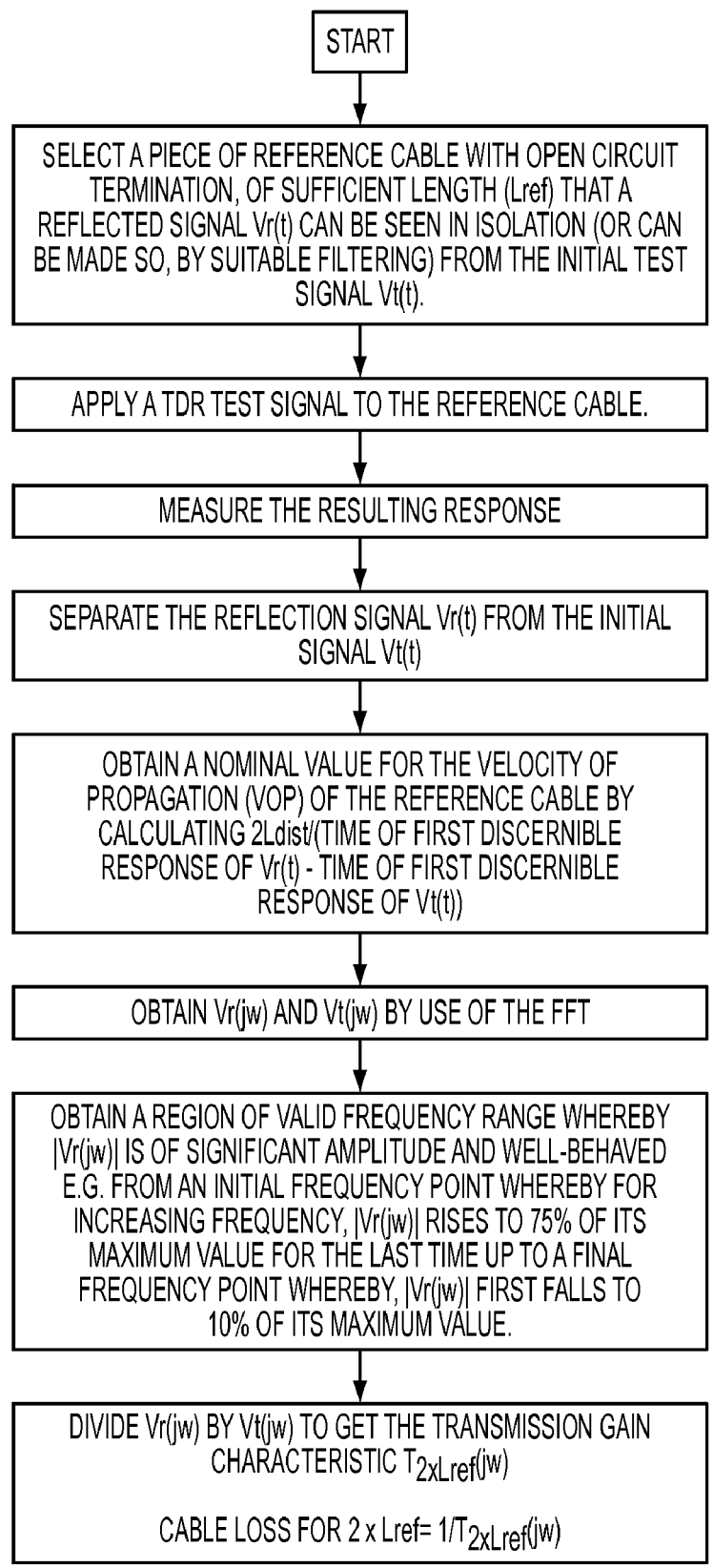
FIG. 8 is a flow chart showing a sequence of operations for calculating a model loss characteristic.

A flow chart of the general process is provided in FIG. 8.

The principles of this technique for TDR estimation of the cable transmission characteristic are based on the principles and references found in Application note AN-4 1989 referred to above, and incorporated herein by reference.

The cable impedance characteristic Zline(jw)=$\sqrt{((R+jwL)/(G+jwC))}$ describes the input impedance.

In general, Zline(jw) is complex and frequency dependent.

A measurement of Zline(jw) is required over a suitable frequency range, to enable the realisation of the fault characteristic model.

The complex reference data for Zline(jw) is obtained by:

Selecting a piece of reference cable with its far end in an open circuit condition. The reference cable should be of sufficient length, Lref, that a reflected signal can be seen in isolation from the applied test signal, i.e. any effects at the input end should have reduced substantially to zero (or can be made so by suitable filtering) prior to the reflection signal appearing.

Using the TDR to apply a test signal to a reference length of cable.

Using the TDR to measure the resultant signal.

Separating the test signal response Vt1(t) from the reflection response Vr1(t).

Terminating the piece of reference cable with a known resistance Rcal.

Using the TDR to apply a test signal to a reference length of cable.

Using the TDR to measure the resultant signal.

Separating the test signal response Vt2(t) from the reflection response Vr2(t).

Performing FFT operations on the resultant signals Vt1(t), Vt2(t), Vr1(t) & Vr2(t) to get the complex values Vt1(jw), Vt2(jw), Vr1(jw) and Vr2(jw).

Calculating the cable impedance Zline(jw) as:

Zline(jw)=Rcal($Vr1$(jw)−$Vr2$(jw))/($Vr1$(jw)+$Vr2$(jw))

which assumes the components Vt1(jw) & Vt2(jw) due to the test signal, are substantially equal.

A "region of validity" should be determined for the use of Zline (jw). This may be determined by looking at the values for Vr1(jw) and Vr2(jw). The reflection response is typically stronger at lower frequencies and diminishes to a negligible level as the frequency increases. If the TDR circuitry includes dc isolation, then very low frequency amplitudes will also diminish to negligible levels.

The information in Zline(jw) should only be used for frequencies where |Vr1(jw)| and |Vr2(jw)| are significant and well-behaved i.e. free from sharp variations. An example of a suitable region of validity might be: from an initial frequency point whereby for increasing frequency, |Vr1(jw)| rises to 75% of its maximum value for the last time up to a final frequency point whereby |Vr1(jw)| first falls to 10% of its maximum value. Similarly a suitable region of validity may be chosen for Vr2(jw), and then only that range where both responses are valid can be chosen.

Figure 9:
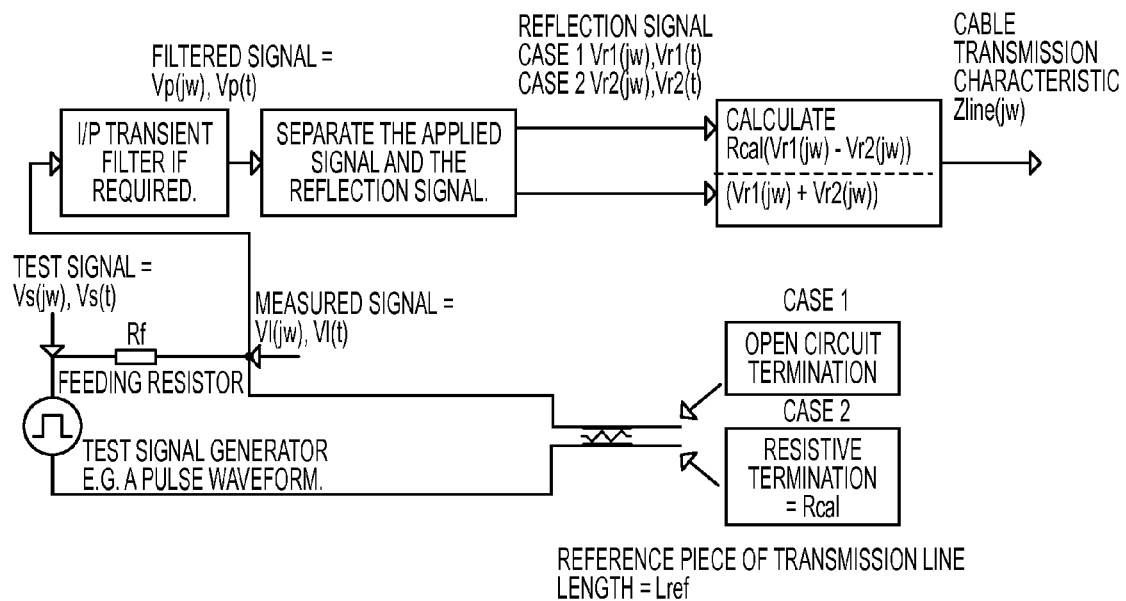
FIG. 9 shows schematically a process embodying the invention for using the TDR arrangement to derive a model cable transmission impedance characteristic.

The arrangement for this is shown in FIG. 9.

Figure 10A:
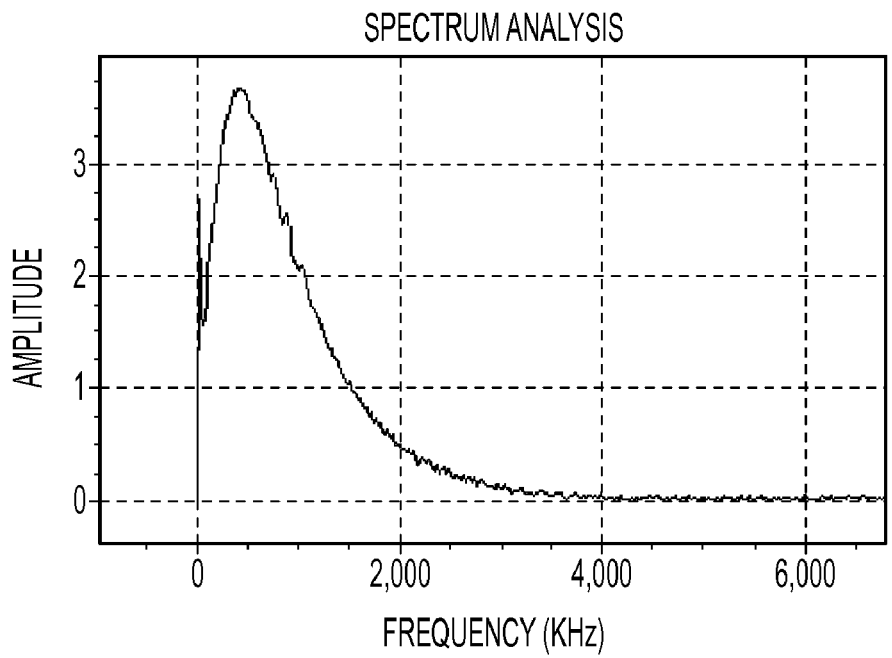
FIGS. 10a and 10b show sample signals of reflection signals using the process of FIG. 9.
Figure 10B:
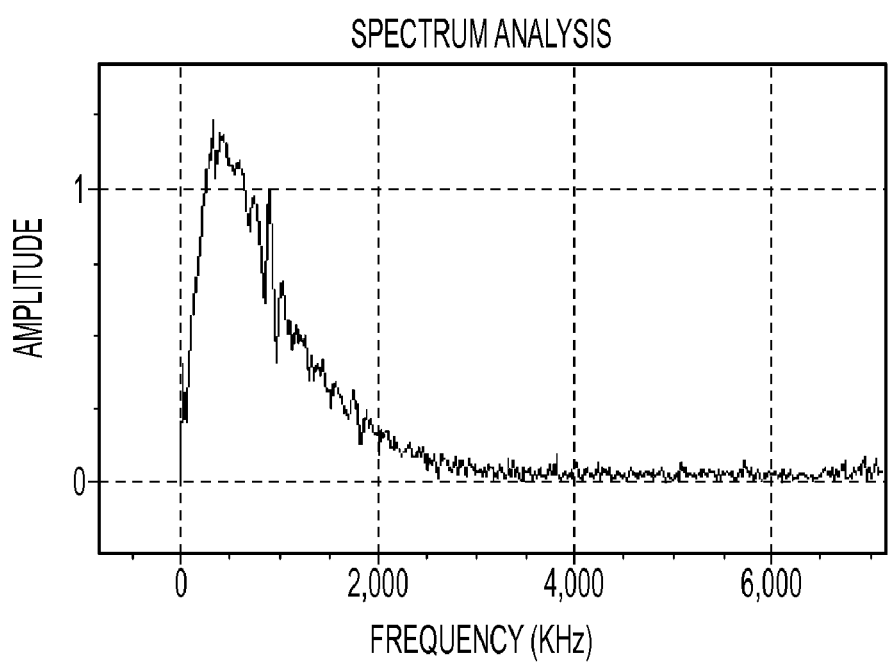

Sample signals for |Vr1(jw)| and |Vr2(jw)| are shown in FIGS. 10a and 10b respectively.

Figure 11A:
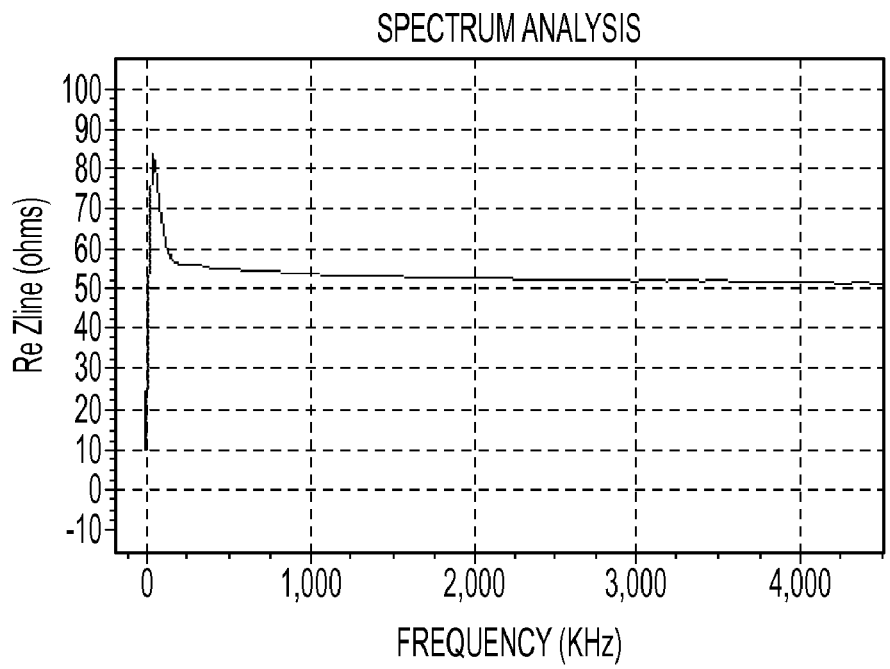
FIGS. 11a and 11b show sample plots of real and imaginary parts of a model characteristic line impedance.
Figure 11B:
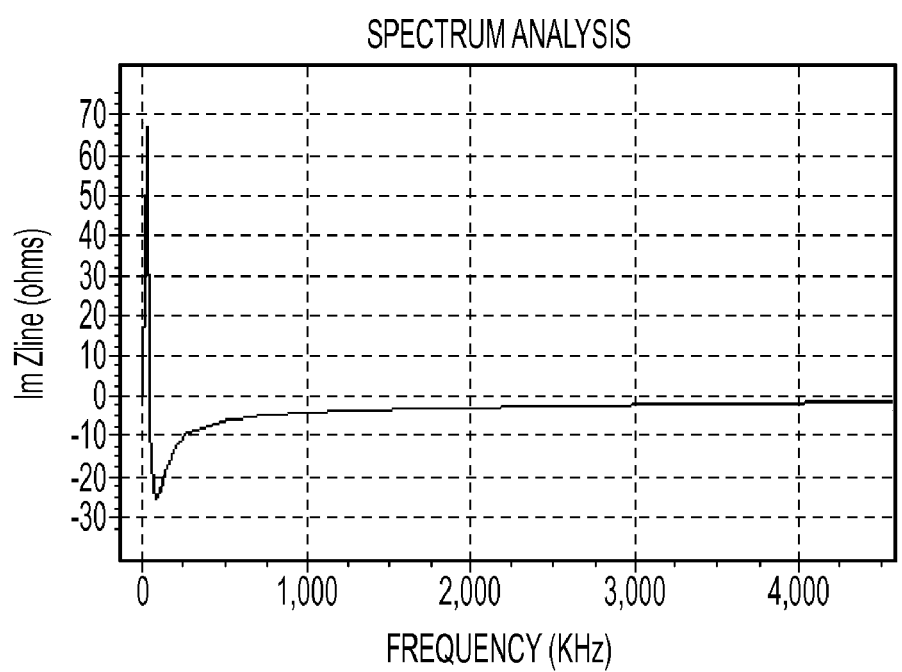

Sample plots for Re Zline(jw) and Im Zline(jw) are shown in FIGS. 11a and 11b respectively.

Figure 12:
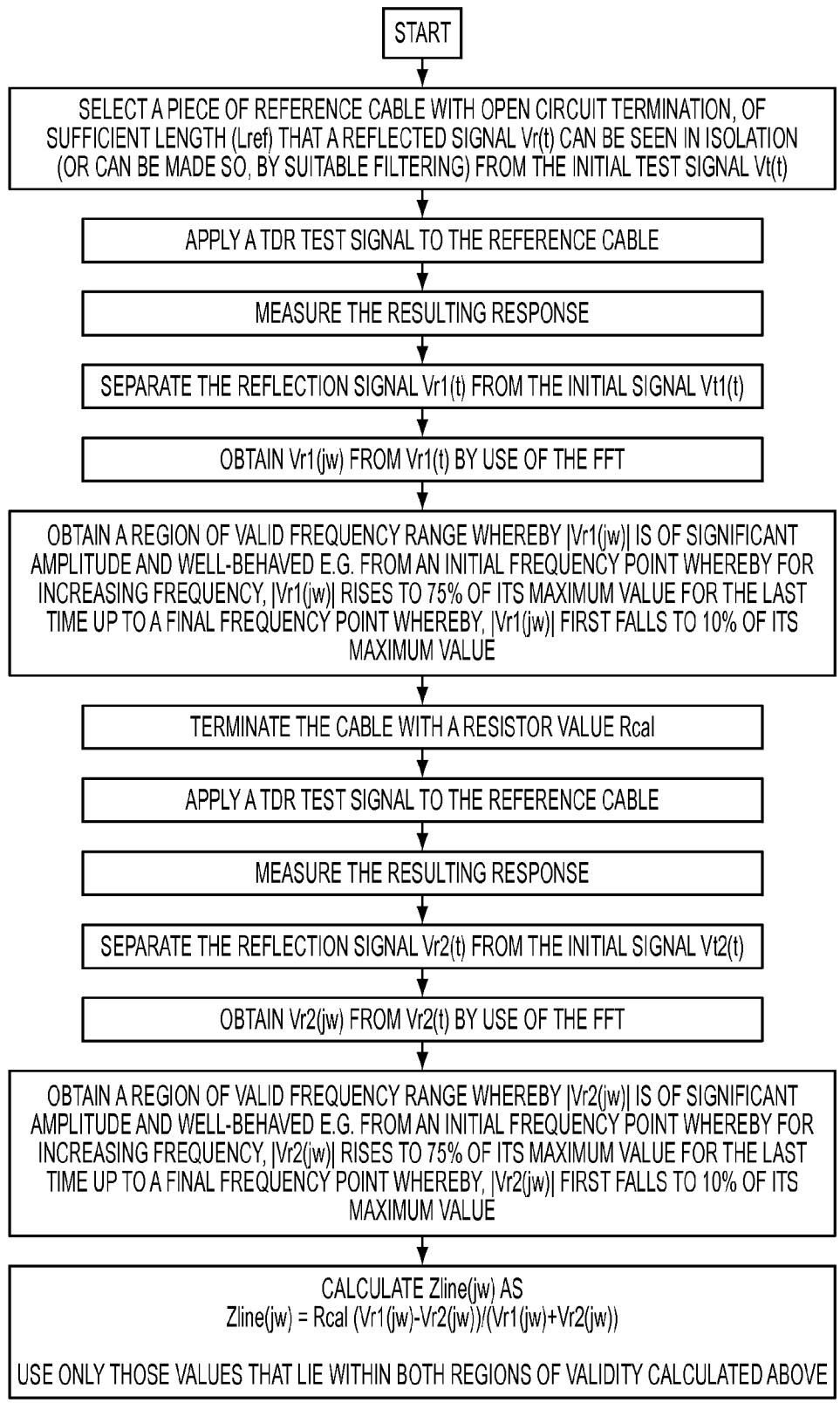
FIG. 12 shows a flow chart of a process embodying the invention for calculating a model characteristic line impedance.

A flow chart of the general process is shown in FIG. 12.

The principles of this technique for TDR estimation of the cable impedance characteristic are based on the principles and references found in the above-referenced IEEE 1969 International Solid-State Circuits Conference paper "Wide Band Impedance Measurement by Fourier Transformation of Network Pulse response" A. S. Faber and C. W. Ho, which is incorporated herein by reference.

Constructing the Variable Length Transmission Line and Fault Effect Model

Having obtained the two sets of complex reference data from the reference cable, the model of the variable length, variable fault transmission line is constructed as follows:

The per unit length gain characteristic is found by:
 Converting $T_{2 \times Lref}$(jw) to polar form |$T_{2 \times Lref}$(jw)| and $\angle T_{2 \times Lref}$(jw) to get the magnitude and delay values.
 Converting |$T_{2 \times Lref}$(jw)| to logarithmic form for example $Log_{10}$|$T_{2 \times Lref}$(jw)|.
 From the scaling principle of equation 1, obtaining the Logarithmic gain per unit length which is (Logarithmic gain at 2×Lref)/2×Lref and the delay per unit length is (delay at 2×Lref)/2×Lref,
  i.e. Logarithmic gain per unit length= $Log_{10}$|$T_{2 \times Lref}$(jw)|/2×Lref
  or Linear gain per unit length=|$T_{pu}$(jw)|= 10^$Log_{10}$|$T_{2 \times Lref}$(jw)|/2×Lref.
 Delay per unit length=$\angle T_{pu}$(jw)=$\angle T_{2 \times Lref}$(jw)/2×Lref To get the gain and delay at a general length Ldist, carry out the following:
 Logarithmic gain for unit length=$Log_{10}$|$T_{pu}$(jw)|;
 Reflection logarithmic gain for length, Ldist=2Ldist $Log_{10}$|$T_{pu}$(jw)|;
 Reflection linear gain for length Ldist= |$T_{2 \times Ldist}$(jw)|=10^2Ldist $Log_{10}$|$T_{pu}$(jw)|;
 Reflection delay for Ldist=$\angle T_{2 \times Ldist}$(jw)=2Ldist $\angle T_{pu}$(jw).
 Finding the values of Re $T_{2 \times Ldist}$(jw) and Im $T_{2 \times Ldist}$(jw) suitable for the frequency domain model and FFT calculations, using the well-known polar to rectangular conversion method.

Consider now the effect of a fault impedance Zfault.

The well-known complex reflection equation provides the description of the effect of a fault impedance Zfault on a transmission line with impedance Zline(jw) as:

ρ(jw)=(Zfault(jw)−Zline(jw))/(Zfault(jw)+Zline(jw))

In the usual signal processing notation, the complete variable-length, variable-fault transmission line model and signals in the frequency domain are:

Model Reflection signal=$Vr$mod(jw) and $Vr$mod(jw)=$Vt$(jw)×$T_{2 \times Ldist}$(jw)×(Zfault(jw)−Zline(jw))/(Zfault(jw)+Zline(jw)).

Use of the Model

The model is used as follows.

General

A measurement is taken of the actual signal applied to the transmission line(cable) under test. This signal can be represented either in the time-domain Vt(t) or alternatively in the frequency domain Vt(jw), by use of the FFT operation.

The complex frequency domain model characteristic $T_{2 \times LdSt}$(jw)×(Zfault(jw)−Zline(jw))/(Zfault(jw)+Zline(jw)) could also be represented in the time domain for use in a time-domain convolution operation, but preferably it is represented here as a frequency domain characteristic so that the required convolution with the applied signal may be done by straightforward complex multiplication as is well known.

The model reflection response in the frequency domain is obtained as:

$$\text{Model reflection}=Vr\text{mod}(jw)=Vt(jw) \times T_{2 \times Ldist}(jw) \times \rho(jw), \qquad (2)$$

where all functions of jw are complex.

The principle for the determination of the location and nature of a transmission line fault can now be described as:
 Using the TDR to apply a test signal to a length of cable under test.
 Using the TDR to measure the resultant signal Vp(t), which may have needed some transient filtering to ensure that Vt(t) and Vr(t) are separated by a period of zero signal.
 Establishing a first trial value for Ldist by measuring:
  (Time of first discernible response of Vr(t)−time of first discernible response of Vt(t))/2 and multiplying it by the reference nominal velocity of propagation VOP, previously described.
 Separating the test signal response Vt(t) from the Vr(t) reflection response.
 Performing an FFT operation on the test signal response and the reflection response.
 Taking the FFT(Vr(t))=Vr(jw).
 Taking the FFT(Vt(t))=Vt(jw).
 Calculating a first estimate of Zfault(jw) as:

Zfault(jw)=Zline(jw)($T_{2 \times Ldist}$(jw)+($Vr$(jw)/$Vt$(jw)))/ ($T_{2 \times Ldist}$(jw)−($Vr$(jw)/$Vt$(jw))).

A "region of validity" should be determined for the use of the error calculations below. This may be determined by looking at the values for Vr(jw). The reflection response is typically stronger at lower frequencies and diminishes to a negligible level as the frequency increases. If the TDR circuitry includes dc isolation, then very low frequency amplitudes will also diminish to negligible levels.

The information in error values below should only be used for frequencies where |Vr(jw)| is significant and well-behaved i.e. free from sharp variations. An example of a suitable region of validity might be: from an initial frequency point whereby for increasing frequency, |Vr(jw)| rises to 75% of its maximum value for the last time up to a final frequency point whereby |Vr(jw)| first falls to 10% of its maximum value.

a) Produce a Model reflection=Vrmod(jw) in the frequency domain using equation 2. Calculate:

magnitude error=|Vr(jw)|−|Vrmod(jw)|, and phase error=∠Vr(jw)−∠Vrmod(jw)

between the actual and the model reflections, using a frequency range within the regions of validity established for the reference cable transmission data, the reference cable impedance data and the fault reflection data.

Choose new trial values of Ldist and Zfault(jw) based either on a predetermined sequence or by an assessment of previous error values.

Return to step a) until the predetermined sequence is completed or error values reach a suitable value.

Choose the values of Ldist and Zfault(jw) that give the minimum error between the actual response and the model response, as the best estimates of the actual fault location and fault characteristic.

Figure 4A:
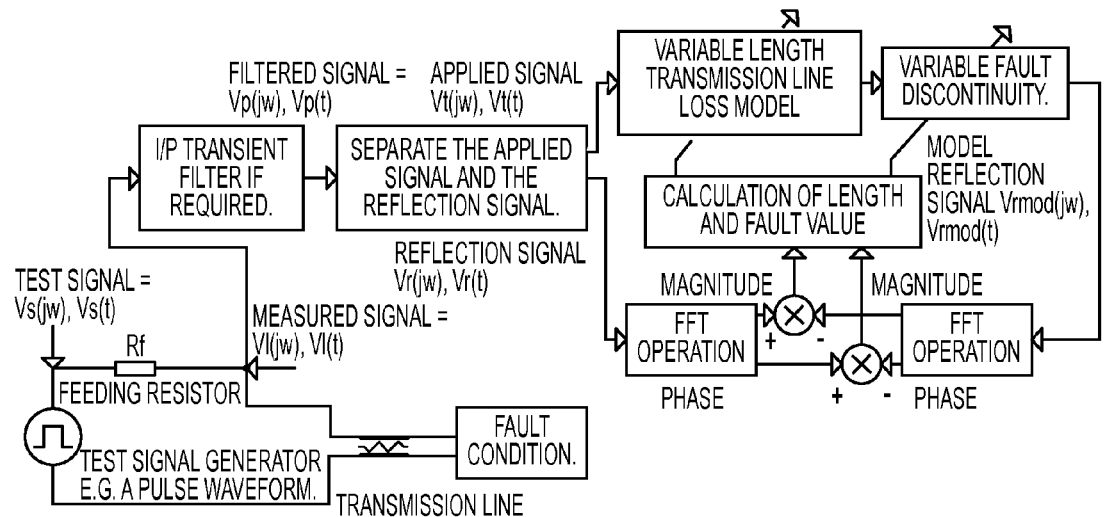
FIG. 4a, and FIG. 4b in simplified form, show an embodiment of the present invention, in diagrammatic form.
Figure 4B:
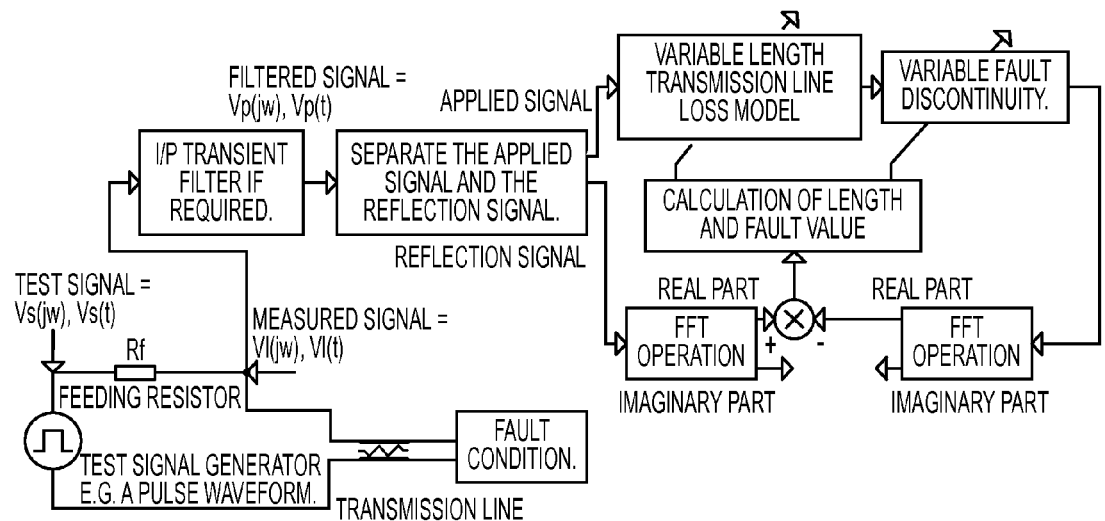

One arrangement for this is shown in FIG. 4a. Many alternative optimisation algorithms are possible. Another is shown in FIGS. 4b and 16b.

Figure 13A:
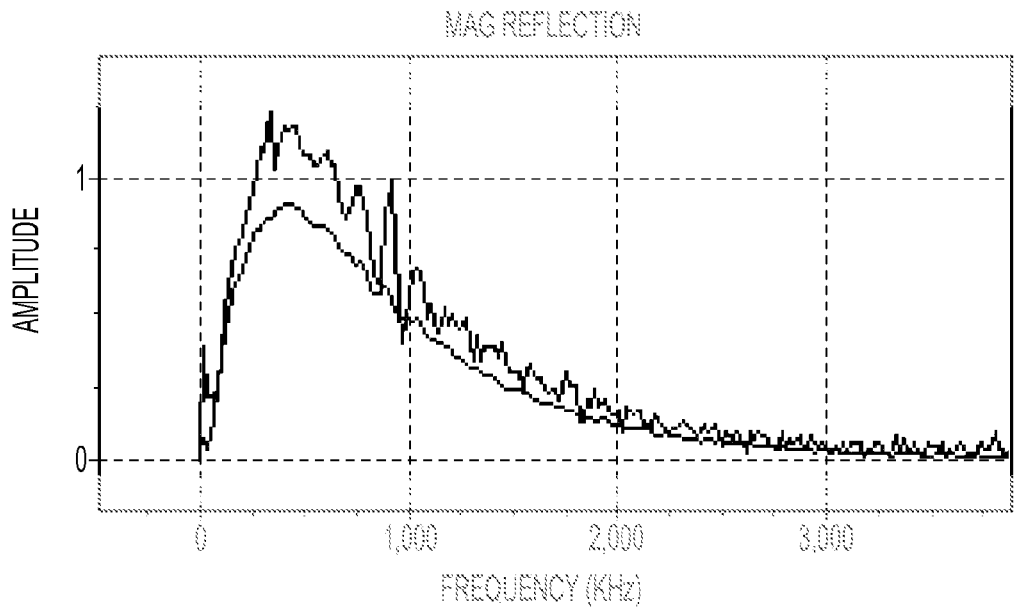
FIG. 13a shows the magnitudes of an actual reflection signal from a cable under test together with a calculated reflection signal from an as yet unoptimised model, in accordance with an embodiment of the invention.

Sample signals for |Vr(jw)| and |Vrmod(jw)| are shown in FIG. 13a where the model Ldist and Zfault values have not yet been tuned.

Figure 13B:
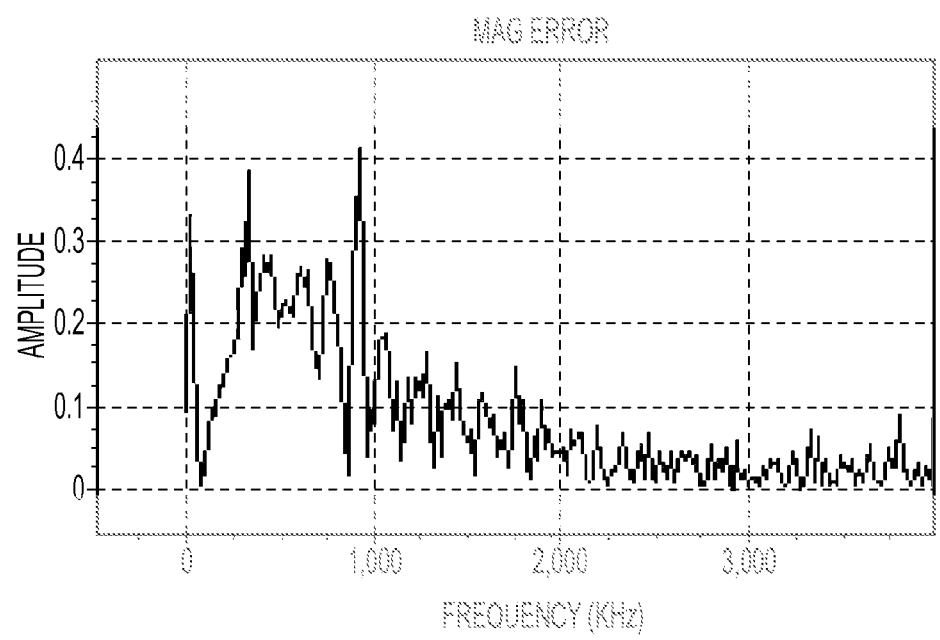

FIG. 13b shows a magnitude of error, |error| plot for the signals in FIG. 13a.

Figure 14A:
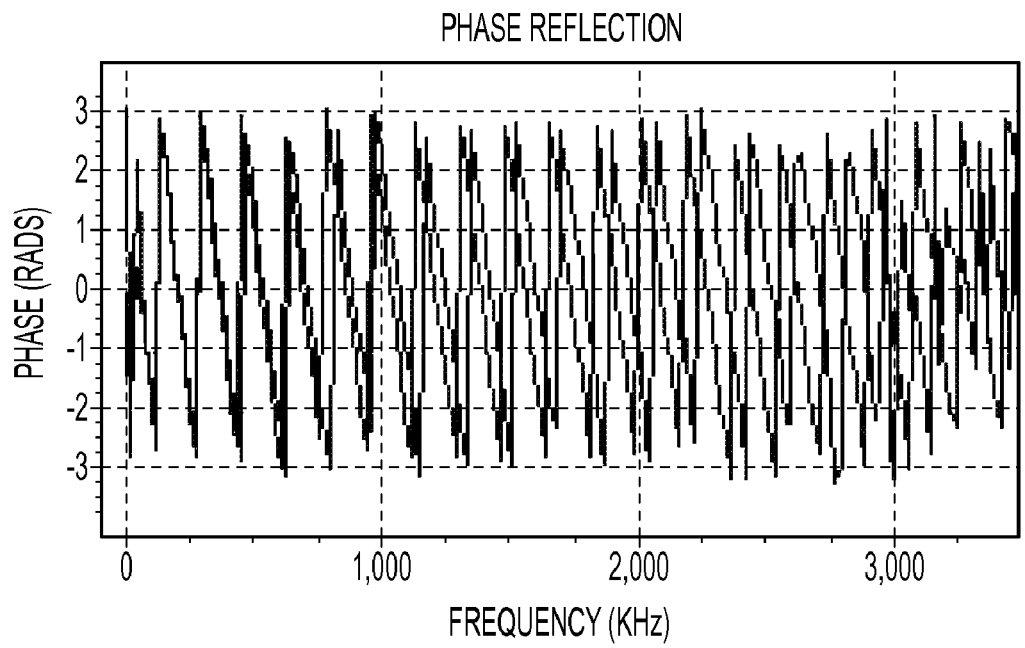
FIGS. 14a and 14b show, respectively, for an untuned model, the phase of actual and predicted values of the reflected signal, and of the phase error between these signals.

Sample signals for ∠Vr(jw) and ∠Vrmod(jw) are shown in FIG. 14a where the model Ldist and Zfault values have not yet been tuned.

Figure 14B:
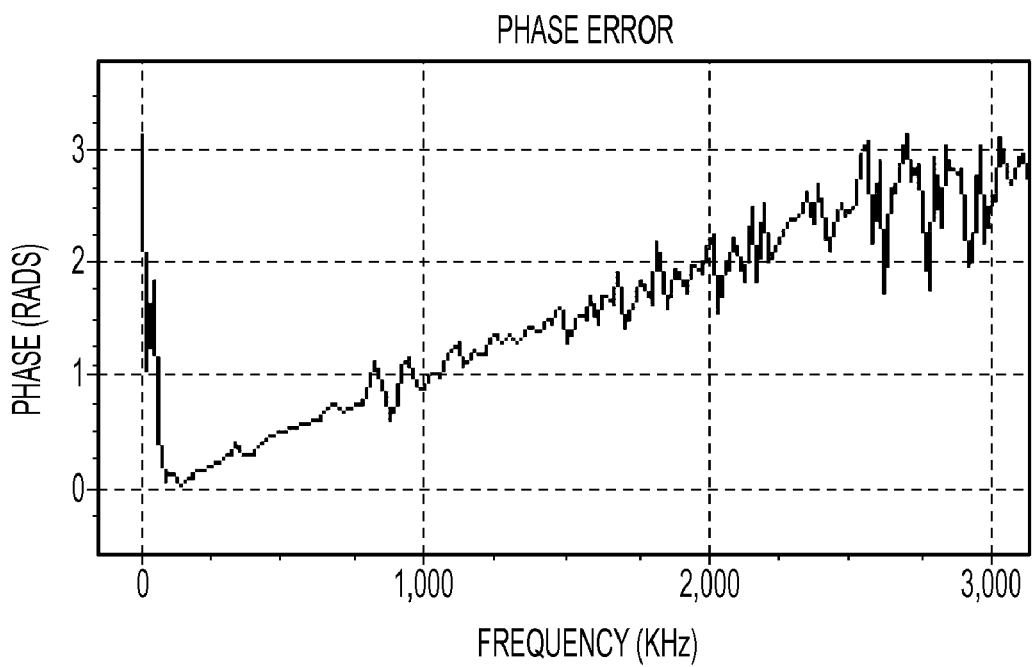

FIG. 14b shows a |error| plot for the signals in FIG. 14a.

The responses of FIG. 15 are obtained by minimising the summation of ||Vr(jw)|−|Vrmod(jw)|| and also minimising of the summation of |∠Vr(jw)−∠Vrmod(jw)| over the valid range of frequencies.

Figure 15A:
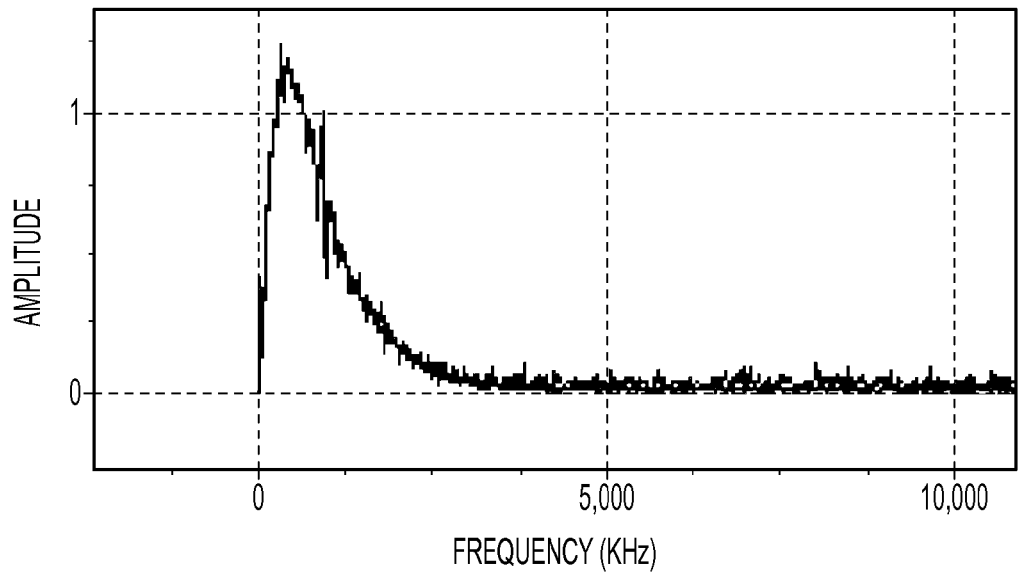
FIG. 15a shows sample magnitudes of reflection signals, after tuning of the values for Ldist and Zfault in accordance with the preferred embodiment.

Sample signals for |Vr(jw)| and |Vrmod(jw)| are shown in FIG. 15a where the model Ldist and Zfault values have been tuned as described above.

Figure 15B:
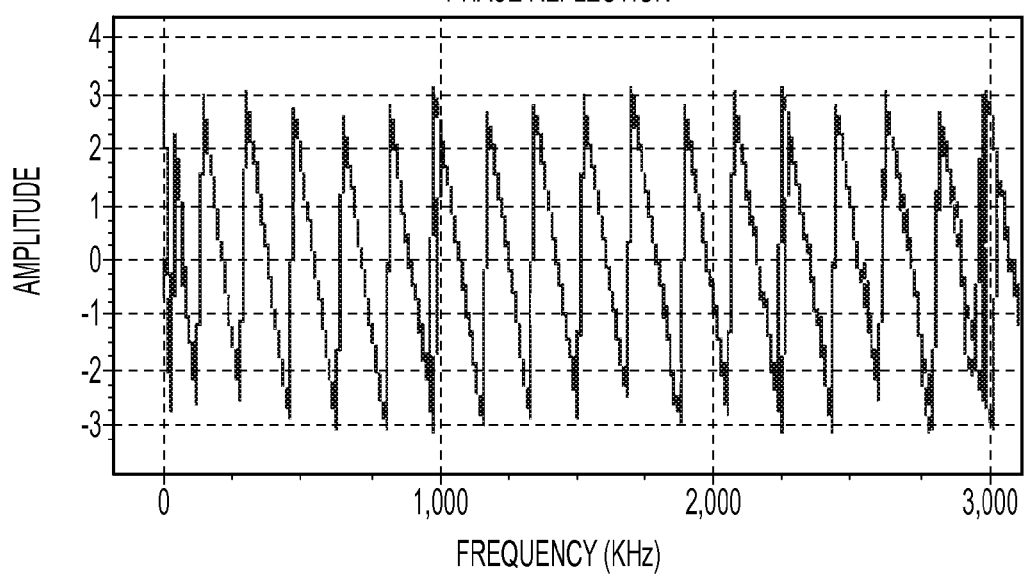

Sample signals for ∠Vr(jw) and ∠Vrmod(jw) are shown in FIG. 15b where the model Ldist and Zfault values have been tuned as described above.

Figure 15C:
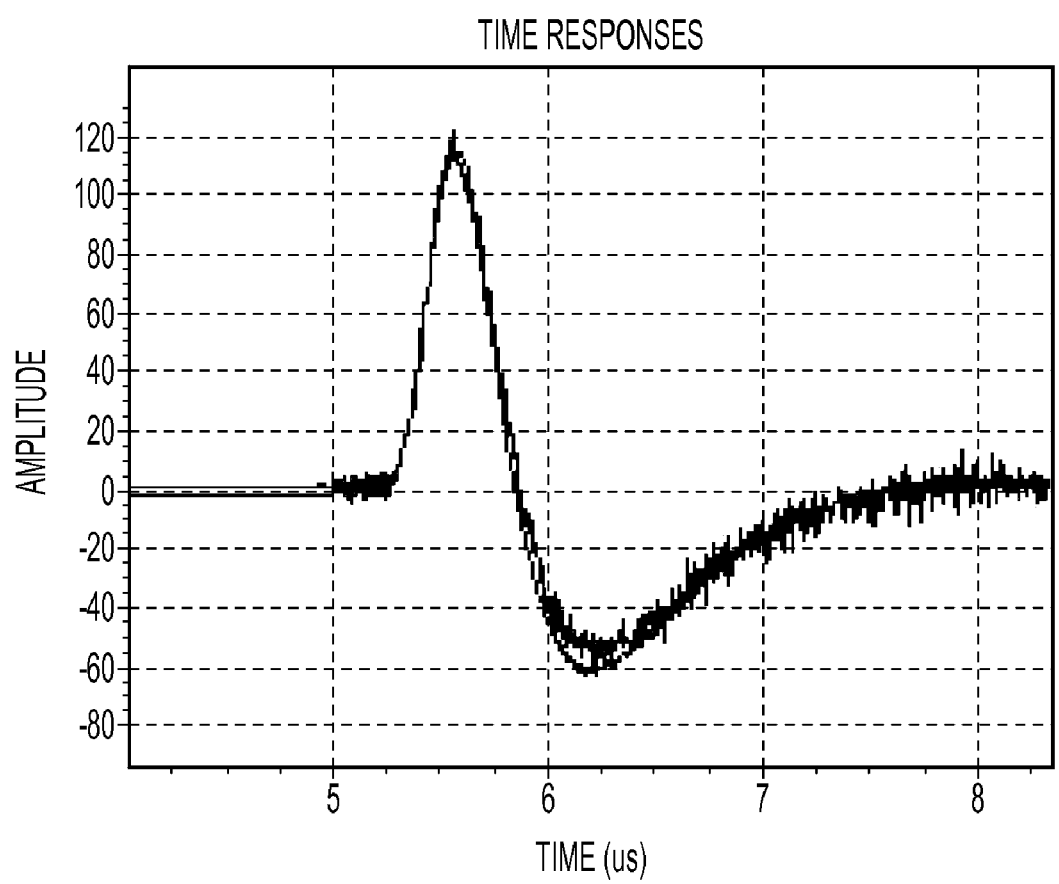
FIG. 15c shows actual and model time domain signals after tuning of the values of Ldist and Zfault.

Sample time domain signals for Vr(t) and Vrmod(t) are shown in FIG. 15c where the model Ldist and Zfault values have been tuned as described above.

This results in this example in the final estimate for Ldist as 550.93 m compared to the actual distance of 551 m. The final estimate for Zfault was 99.7 ohms compared to the actual fault of 99.6 ohms.

Figure 16A:
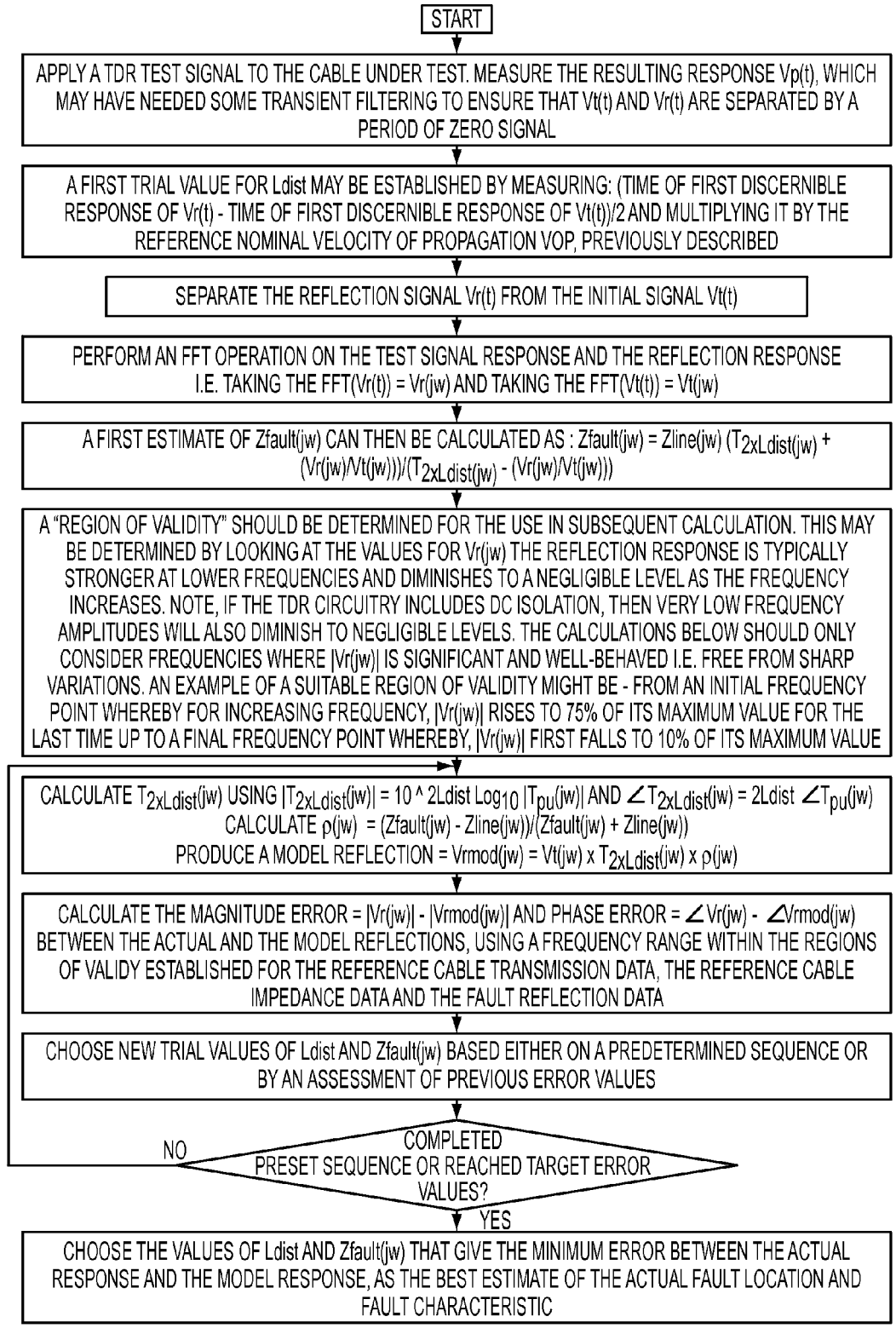
FIG. 16a shows one example of the process embodying the invention for optimising, i e tuning Ldist and Zfault.
Figures 1, 16B:
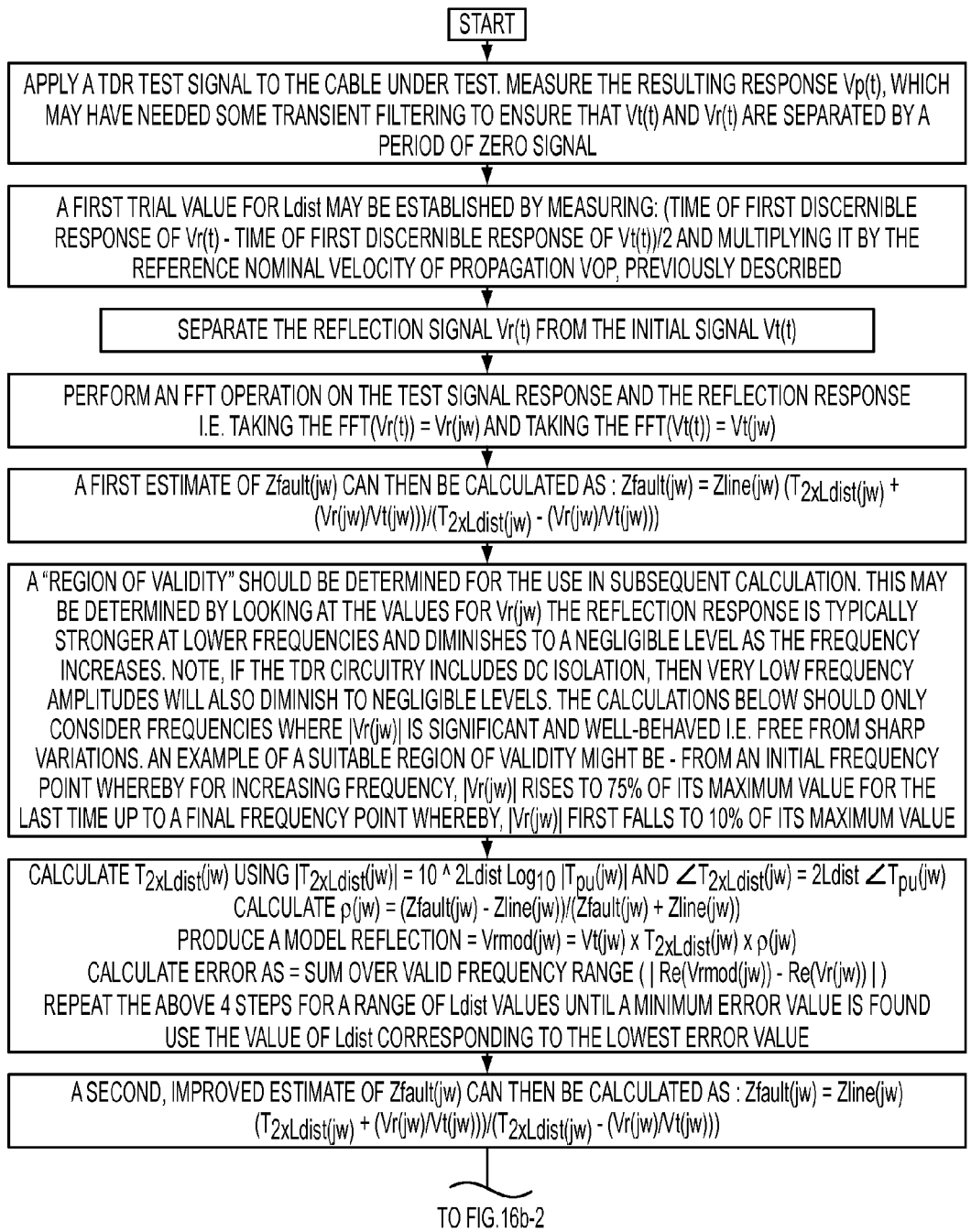
Figures 2, 16B:
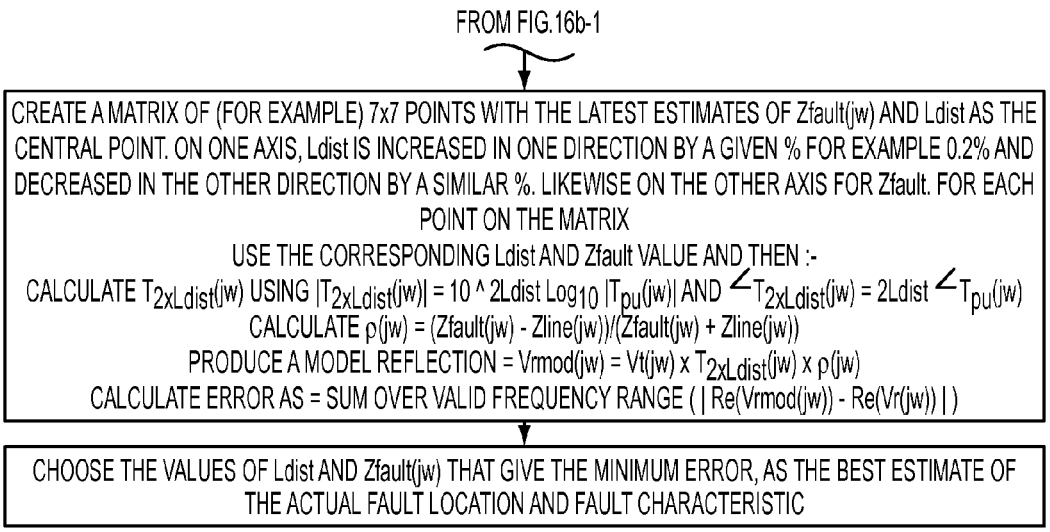

One flow chart of the general process is provided in FIG. 16a. An alternative, more specific, example is shown in FIG. 16b. Other processes are of course possible.

The block in FIG. 4a labeled "Calculation of Length and Fault Value" in its simplest form could just apply many combinations of Length and Fault value to the model, without regard to the resulting errors. At the end of that, the combination with the lowest error score can be used to determine the best value of Length and Fault. This works well, but not surprisingly takes a long time.

A variety of known search techniques can be applied to the task of efficiently tuning parameters to achieve the minimisation of a cost function.

The arrangement shown in FIG. 4b is simpler than that in FIG. 4a in that only one set of model and actual signals is evaluated.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

The invention claimed is:

1. A method of time domain reflectometry, comprising:
transmitting a test signal along a cable under test from one end and sensing and recording a reflected signal from the cable at that end;
using the recorded, reflected signal to estimate the distance, Ldist, from the one end to a discontinuity on the cable;
separating a test signal component from the remainder, Vr, of the reflected signal;
estimating the impedance, Zfault, of the discontinuity from known, predetermined values of the characteristic impedance, Zline, and of the characteristic gain, T, of a reference cable, and from the said separated test signal and reflected signal components;
calculating an estimation error as a difference between a model reflection signal, Vrmod, expected of the cable under test based on the characteristic impedance and characteristic gain and the estimated impedance, Zfault and distance, Ldist, and the actual reflection signal Vr;
choosing new estimated values of Ldist and Zfault in accordance with a predetermined algorithm such as to approach optimal values;
repeating the aforesaid step of calculating the estimation error until a predetermined condition has been satisfied; and
outputting the values of Ldist and Zfault that gave the least error.

2. A method according to claim 1, further comprising determining a velocity of propagation for a reference cable and using that to estimate the distance, Ldist.

3. A method according to claim 2, further comprising calculating the velocity of propagation for the reference cable by measuring the interval between a characteristic signal component on the transmitted and received signals at the one end, and from the reference cable length Lref.

4. A method according to claim 1, further comprising transmitting the test signal along a reference cable of length Lref from one end, the other end being terminated by an open circuit, and sensing and recording a first reflected signal from the cable at the one end;
using the recorded, first reflected signal to determine its gain characteristic, $T_{2\cdot Lref}$;
similarly transmitting the test signal with the other end terminated by a known resistance, to record a second reflected signal; and
calculating the characteristic impedance, Zline, from the known resistance and from the first and second reflected signals.

5. A method according to claim 4, further comprising performing a Fourier transform separately on the test signal component and the remainder of the reflected signal from the reference cable, and using the results to obtain the characteristic gain, T.

6. A method according to claim 4, further comprising performing a Fourier transform separately on the test signal component and on the remainder of the reflected signal, for both the first and the second reflected signals, from the reference cable, and using the results to obtain the characteristic impedance, Zline.

7. A method according to claim 4, further comprising performing a Fourier transform separately on the test signal component and the remainder of the reflected signal from the cable under test, and using the results to estimate the impedance, Zfault.

8. A method according to claim 4, further comprising performing Fourier transforms to provide the reflected signal from the cable under test, and the impedance Zline, in the frequency domain.

9. A method according to claim 8, further comprising calculating the estimation error as differences in phase and magnitude between the model reflection signal expected of the cable under test, and the actual reflection signal.

10. A time domain reflectometer for testing an electrical cable, comprising:
   a test signal generator connected to a pair of terminals for connection to the ends of the electrical cable under test; and
   a signal processor connected to the terminals to receive a reflected signal from a test signal transmitted into the cable under test;
   the signal processor being programmed to sense and record a reflected signal from the cable;
   transmit a test signal along a cable under test from one end and sensing and recording a reflected signal from the cable at that end;
   use the recorded, reflected signal to estimate the distance, Ldist, from the one end to a discontinuity on the cable;
   separate a test signal component from the remainder, Vr, of the reflected signal;
   estimate the impedance, Zfault, of the discontinuity from known, predetermined values of the characteristic impedance, Zline, and of the characteristic gain, T, of a reference cable, and from the said separated test signal and reflected signal components;
   calculate an estimation error as a difference between a model reflection signal, Vrmod, expected of the cable under test based on the characteristic impedance and characteristic gain and the estimated impedance, Zfault and distance, Ldist, and the actual reflection signal Vr;
   choose new estimated values of Ldist and Zfault in accordance with a predetermined algorithm such as to approach optimal values;
   repeat the aforesaid step of calculating the estimation error until a predetermined condition has been satisfied; and
   output the values of Ldist and Zfault that gave the least error.

11. A time domain reflectometer according to claim 10, wherein the signal processor is programmed to determine a velocity of propagation for a reference cable and use that to estimate the distance, Ldist.

12. A time domain reflectometer according to claim 11, wherein the signal processor is programmed to calculate the velocity of propagation for the reference cable by measuring the interval between a characteristic signal component on the transmitted and received signals at the one end, and from the reference cable length Lref.

13. A time domain reflectometer according to claim 10, wherein the signal processor is programmed to:
   transmit the test signal along a reference cable of length Lref from one end, the other end being terminated by an open circuit, and to sense and record a first reflected signal from the cable at the one end;
   use the recorded, first reflected signal to determine its gain characteristic, $T_{2,Lref}$;
   similarly transmit the test signal with the other end terminated by a known resistance, to record a second reflected signal; and
   calculate the characteristic impedance, Zline, from the known resistance and from the first and second reflected signals.

14. A time domain reflectometer according to claim 13, wherein the signal processor being programmed to perform a Fourier transform separately on the test signal component and the remainder of the reflected signal from the reference cable, and use the results to obtain the characteristic gain, T.

15. A time domain reflectometer according to claim 13, wherein the signal processor is programmed to perform a Fourier transform separately on the test signal component and on the remainder of the reflected signal, for both the first and the second reflected signals, from the reference cable, and use the results to obtain the characteristic impedance, Zline.

16. A time domain reflectometer according to claim 10, wherein the signal processor is programmed to perform a Fourier transform separately on the test signal component and the remainder of the reflected signal from the cable under test, and use the results to estimate the impedance, Zfault.

17. A time domain reflectometer according to claim 10, wherein the signal processor is programmed to perform Fourier transforms to provide the reflected signal from the cable under test, and the impedance Zline, in the frequency domain.

18. A time domain reflectometer according to claim 17, wherein the signal processor is programmed to calculate the estimation error as differences in phase and magnitude between the model reflection signal expected of the cable under test, and the actual reflection signal.

19. Time domain reflectometer apparatus for testing an electrical cable, comprising:
   test signal generator means connected to a pair of terminals for connection to the ends of the electrical cable under test; and
   signal processor means connected to the terminals to receive a reflected signal from a test signal transmitted into the cable under test;
   the signal processor means being programmed to sense and record a reflected signal from the cable;
   transmit a test signal along a cable under test from one end and sense and record a reflected signal from the cable at that end;
   use the recorded, reflected signal to estimate the distance, Ldist, from the one end to a discontinuity on the cable;
   separate a test signal component from the remainder, Vr, of the reflected signal;
   estimate the impedance, Zfault, of the discontinuity from known, predetermined values of the characteristic impedance, Zline, and of the characteristic gain, T, of a reference cable, and from the said separated test signal and reflected signal components;
   calculate an estimation error as a difference between a model reflection signal, Vrmod, expected of the cable under test based on the characteristic impedance and characteristic gain and the estimated impedance, Zfault and distance, Ldist, and the actual reflection signal Vr;
   choose new estimated values of Ldist and Zfault in accordance with a predetermined algorithm such as to approach optimal values;
   repeat the aforesaid step of calculating the estimation error until a predetermined condition has been satisfied; and
   output the values of Ldist and Zfault that gave the least error.

* * * * *